United States Patent
Lin et al.

(10) Patent No.: US 11,552,054 B2
(45) Date of Patent: Jan. 10, 2023

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Wei-Ting Lin, Taipei (TW); Ping-Kang Huang, Chiayi (TW); Sao-Ling Chiu, Hsinchu (TW); Shang-Yun Hou, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/916,098

(22) Filed: Jun. 29, 2020

(65) Prior Publication Data

US 2021/0407963 A1    Dec. 30, 2021

(51) Int. Cl.
| | |
|---|---|
| *H01L 25/065* | (2006.01) |
| *H01L 23/04* | (2006.01) |
| *H01L 23/31* | (2006.01) |
| *H01L 23/36* | (2006.01) |
| *H01L 23/16* | (2006.01) |
| *H01L 21/56* | (2006.01) |

(52) U.S. Cl.
CPC .......... *H01L 25/0657* (2013.01); *H01L 21/56* (2013.01); *H01L 23/04* (2013.01); *H01L 23/16* (2013.01); *H01L 23/31* (2013.01); *H01L 23/36* (2013.01)

(58) Field of Classification Search
CPC ..... H01L 25/0657; H01L 23/04; H01L 23/16; H01L 23/31; H01L 23/36
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,287,194 B2 * | 3/2016 | Hung .................... H01L 23/562 |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |

(Continued)

*Primary Examiner* — Peniel M Gumedzoe
(74) *Attorney, Agent, or Firm* — JCIPRNET

(57) ABSTRACT

A package structure includes a semiconductor device, a circuit substrate and a heat dissipating lid. The semiconductor device includes a semiconductor die. The circuit substrate is bonded to and electrically coupled to the semiconductor device. The heat dissipating lid is bonded to the circuit substrate and thermally coupled to the semiconductor device, where the semiconductor device is located in a space confined by the heat dissipating lid and the circuit substrate. The heat dissipating lid includes a cover portion and a flange portion bonded to a periphery of the cover portion. The cover portion has a first surface and a second surface opposite to the first surface, where the cover portion includes a recess therein, the recess has an opening at the second surface, and a thickness of the recess is less than a thickness of the cover portion, where the recess is part of the space.

20 Claims, 13 Drawing Sheets

(56) References Cited

U.S. PATENT DOCUMENTS

| | | | |
|---|---|---|---|
| 9,735,131 B2 | 8/2017 | Su et al. | |
| 2008/0017975 A1* | 1/2008 | Deppisch | H01L 23/42 |
| | | | 257/E21.503 |
| 2014/0264821 A1* | 9/2014 | Tang | H01L 23/3675 |
| | | | 257/713 |
| 2018/0350755 A1* | 12/2018 | Huang | H01L 25/18 |
| 2019/0172903 A1* | 6/2019 | Wang | H01L 25/50 |
| 2019/0348340 A1* | 11/2019 | Kwon | H01L 23/552 |
| 2019/0385929 A1* | 12/2019 | Ku | H01L 24/24 |

* cited by examiner

PACKAGE STRUCTURE AND METHOD OF MANUFACTURING THE SAME

BACKGROUND

Semiconductor devices and integrated circuits (ICs) are typically manufactured on a single semiconductor wafer. The dies of the wafer may be processed and packaged with other semiconductor devices or dies at the wafer level, and various technologies have been developed for the wafer level packaging. Semiconductor processing for fabrications of the semiconductor devices and ICs continues to evolve towards increasing device-density, higher numbers of active devices (mainly transistors) of ever decreasing device dimensions. As electronic products are continuously miniaturized, heat dissipation of the packaged semiconductor devices and ICs have become an important issue for packaging technology.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
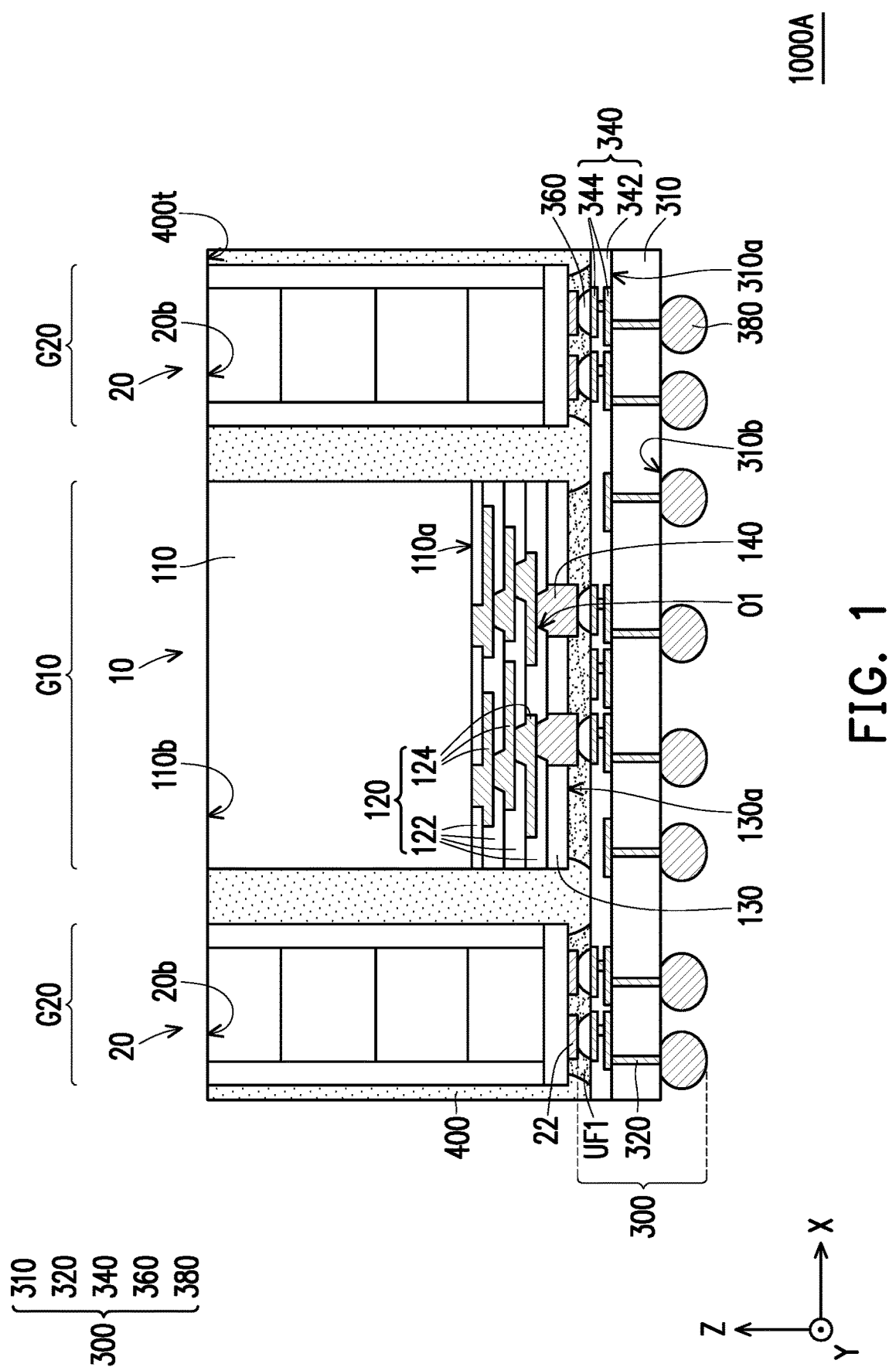
FIG. 1 through FIG. 4 are schematic cross-sectional views of various stages in a manufacturing method of a package structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth", and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 5:
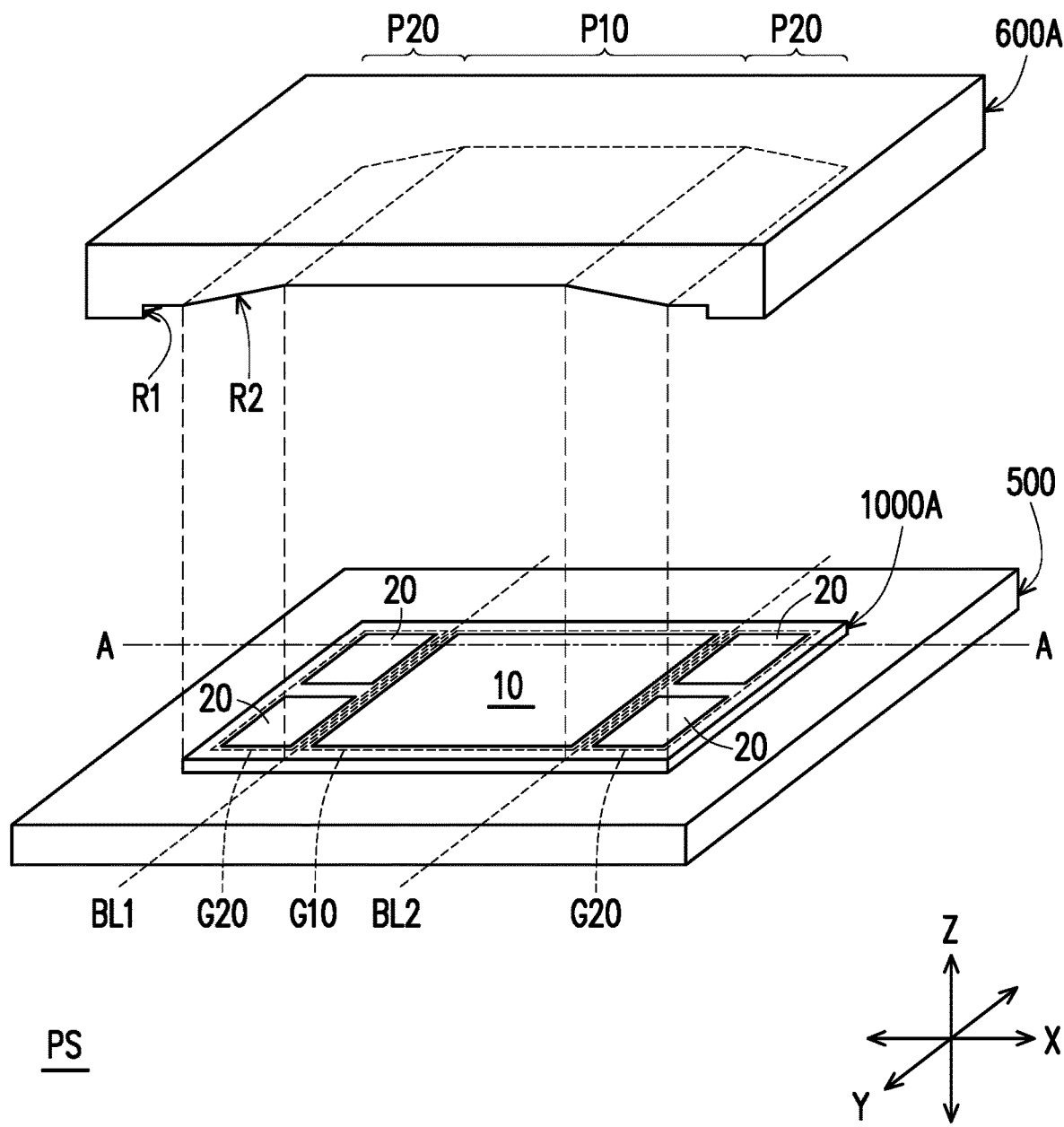
FIG. 5 is a schematic explosive view illustrating the package structure depicted in FIG. 4.
Figure 6:
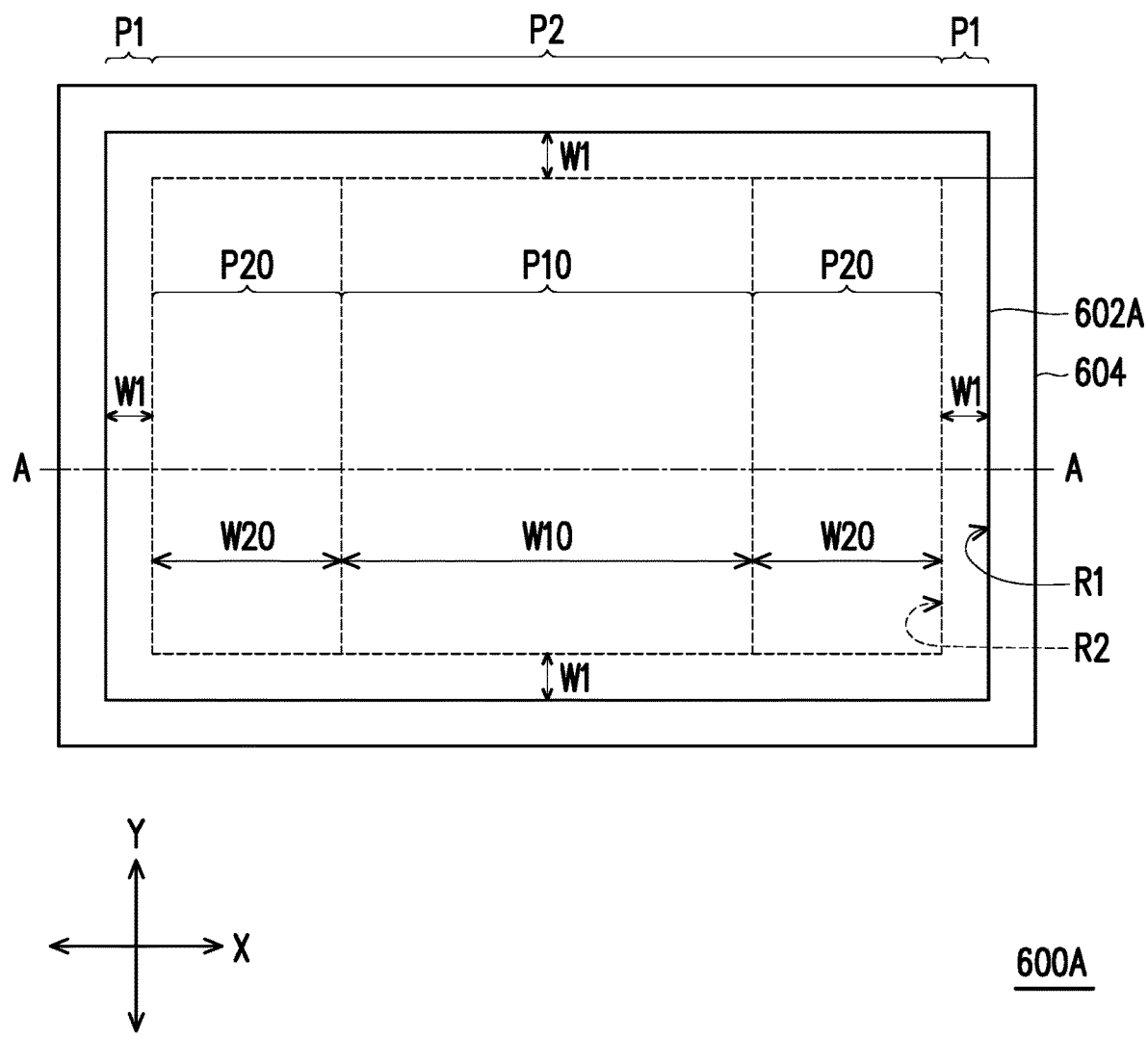
FIG. 6 illustrates a floor plan of a heat dissipating lid of the package structure depicted in FIG. 5.
Figure 7:
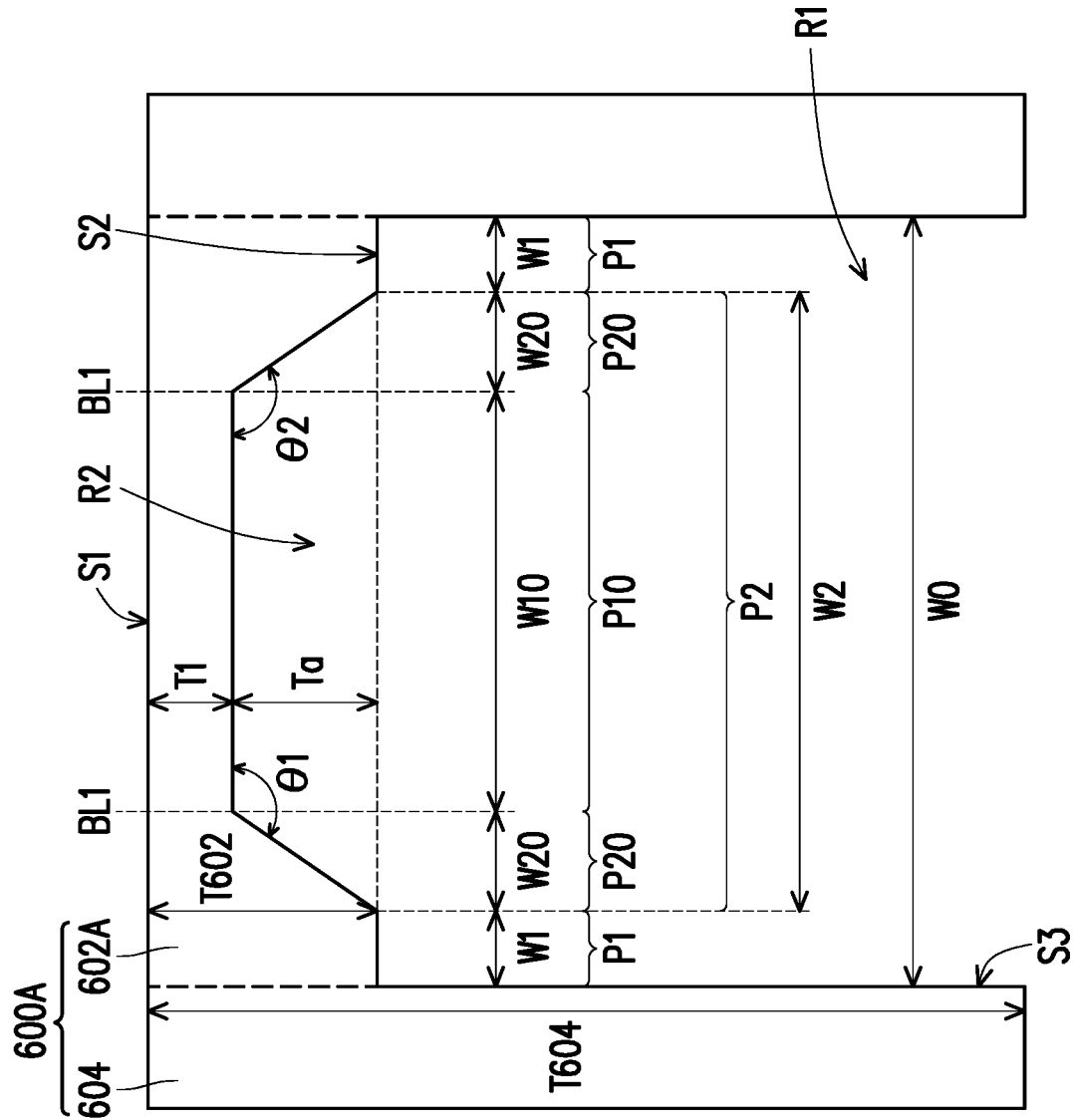
FIG. 7 is a schematic cross-sectional view of a heat dissipating lid of the package structure depicted in FIG. 5.

FIG. 1 through FIG. 4 are schematic cross-sectional views of various stages in a manufacturing method of a package structure in accordance with some embodiments of the disclosure. FIG. 5 is a schematic explosive view illustrating the package structure depicted in FIG. 4, where FIG. 1 through FIG. 4 are the schematic cross-sectional views taken along a line AA depicted in FIG. 5. FIG. 6 illustrates a floor plan of a heat dissipating lid of the package structure depicted in FIG. 5. FIG. 7 is a schematic cross-sectional view of a heat dissipating lid of the package structure depicted in FIG. 5. It is to be noted that the process steps described herein cover a portion of the manufacturing processes used to fabricate a (semiconductor) package structure. The embodiments are intended to provide further explanations but are not used to limit the scope of the disclosure. In FIG. 1 to FIG. 4, one first (semiconductor) chip or die and multiple second (semiconductor) chips or dies are shown, while one (semiconductor) package structure are shown to represent plural (semiconductor) package structures obtained following the (semiconductor) manufacturing method, the disclosure is not limited thereto. In other embodiments, one or more than one first (semiconductor) chip or die and one or more than one second (semiconductor) chip or die are shown, while one or more than one (semiconductor) package structure are shown to represent plural (semiconductor) package structures obtained following the (semiconductor) manufacturing method.

Referring to FIG. 1, in some embodiments, a semiconductor device 1000A is provided, where the semiconductor device 1000A includes at least one semiconductor die, an interposer 300, and an insulating encapsulation 400. For example, the at least one semiconductor die and the insulating encapsulation 400 are located at a side of the interposer 300, where the at least one semiconductor die is molded in the insulating encapsulation 400.

In some embodiments, the at least one semiconductor die includes at least one semiconductor die 10 and at least one semiconductor die 20. For example, only one semiconductor die 10 and four semiconductor dies 20 are depicted in FIG. 5 for illustrative purposes, where the semiconductor dies 20 are grouped into two groups (e.g. G20) each being arranged in the form of a matrix, such as a N×N array or a N×M array (N, M>0, N may or may not be equal to M), to be arranged beside a group (e.g. G10) of the semiconductor die 10. For example, the group G10 includes one semiconductor die 10, and each group G20 includes two semiconductor dies 20, where the groups G20 each are arranged into a 1×2 array, as shown in FIG. 5. It is appreciated that only one semiconductor die 10 and two semiconductor dies 20 are shown in FIG. 1 through FIG. 4, as FIG. 1 to FIG. 4 are the cross-sectional views of FIG. 5 along the line AA. In some other embodiments of which a plurality of semiconductor dies 10 are included (will be further described later in FIG. 8A and FIG. 8B), the plurality of semiconductor dies 10 are arranged in the form of a matrix, such as a N'×N' array or a N'×M' array (N', M'>0, N' may or may not be equal to M') and/or are grouped into one or more groups G10.

However, the disclosure is not limited thereto; alternatively, depending on the demand and design requirement, the number of the semiconductor die 10 may be one or more than one, while the number of the semiconductor dies 20 may be zero, one or more than one. In other words, for a layout of the semiconductor device in the disclosure, a number of the group G10 (involving only semiconductor die 10) is one or more than one while a number of the group G20 (involving only semiconductor die 20) is zero, one or more than one. It is appreciated that a number of the semiconductor die 10 in one group G10 may be one or more than one, and a number of the semiconductor die 20 in one group G20 may be one or more than one, the disclosure is not limited thereto.

In some embodiments, the semiconductor die 10 includes a semiconductor substrate 110, an interconnect structure 120 disposed on the semiconductor substrate 110, a passivation layer 130 disposed on the interconnect structure 120, and a plurality of conductive vias 140 penetrating through the passivation layer 130 and disposed on the interconnect structure 120. As shown in FIG. 1, the semiconductor substrate 110 has a frontside surface 110a and a backside surface 110b opposite to the frontside surface 110a, and the interconnect structure 120 is located on the frontside surface 110a of the semiconductor substrate 110, where the interconnect structure 120 is sandwiched between the semiconductor substrate 110 and the passivation layer 130 and sandwiched between the semiconductor substrate 110 and the conductive vias 140, for example.

In some embodiments, the semiconductor substrate 110 is a silicon substrate including active components (e.g., transistors and/or memories such as N-type metal-oxide semiconductor (NMOS) and/or P-type metal-oxide semiconductor (PMOS) devices, or the like) and/or passive components (e.g., resistors, capacitors, inductors or the like) formed therein. In some embodiments, such active components and passive components are formed in a front-end-of-line (FEOL) process. In an alternative embodiment, the semiconductor substrate 110 is a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

The semiconductor substrate 110 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. For example, the semiconductor substrate 110 has an active surface (e.g., the frontside surface 110a), sometimes called a top side, and an inactive surface (e.g., the backside surface 110b), sometimes called a bottom side.

In some embodiments, the interconnect structure 120 includes one or more inter-dielectric layers 122 and one or more patterned conductive layers 124 stacked alternately. For examples, the inter-dielectric layers 122 are silicon oxide layers, silicon nitride layers, silicon oxy-nitride layers, or dielectric layers formed by other suitable dielectric materials, and are formed by deposition or the like. For examples, the patterned conductive layers 124 are patterned copper layers or other suitable patterned metal layers, and are formed by electroplating or deposition. However, the disclosure is not limited thereto. Alternatively, the patterned conductive layers 124 may be formed by dual-damascene method. The number of the inter-dielectric layers 122 and the number of the patterned conductive layers 124 may be less than or more than what is depicted in FIG. 1, and may be designated based on the demand and/or design layout; the disclosure is not specifically limited thereto. In some embodiments, the interconnect structure 120 is formed in a back-end-of-line (BEOL) process. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In certain embodiments, as shown in FIG. 1, the patterned conductive layers 124 are sandwiched between the inter-dielectric layers 122, where a surface of the outermost layer of the patterned conductive layers 124 is at least partially exposed by a plurality of openings O1 formed in a outermost layer of the inter-dielectric layers 122 to connect to later formed component(s) for electrical connection (e.g. with the conductive vias 140), and a surface of an innermost layer of the patterned conductive layers 124 is at least partially exposed by a plurality of openings (no marked) formed in a innermost layer of the inter-dielectric layers 122 and electrically connected to the active components and/or passive components included in the semiconductor substrate 110. The shapes and numbers of the openings O1 and the shapes and numbers of the openings formed in the innermost layer of the inter-dielectric layers 122 are not limited in the disclosure, and may be designated based on the demand and/or design layout.

In some embodiments, as shown in FIG. 1, the passivation layer 130 is formed on the interconnect structure 120, where parts of the interconnect structure 120 is covered by and in contact with the passivation layer 130, and rest of the interconnect structure 120 is accessibly revealed by the passivation layer 130. As shown in FIG. 1, the passivation layer 130 has a substantially planar surface 130a, for example. In certain embodiments, the surface 130a of the passivation layer 130 is leveled and may have a high degree of planarity and flatness, which is beneficial for the later-formed layers/elements (e.g. the conductive vias 140). In some embodiments, the passivation layer 130 includes a polyimide (PI) layer, a polybenzoxazole (PBO) layer, a silicon dioxide based (non-organic) layer or other suitable polymer (or organic) layer, and is formed by deposition or the like. The disclosure is not limited thereto. The disclosure does not specifically limit a thickness of the passivation layer 130 as long as the surface 130a of the passivation layer 130 can maintain its high degree of planarity and flatness. In the disclosure, the surface 130a of the passivation layer may be referred to as a front surface of the semiconductor die 10.

In some embodiments, the conductive vias 140 are formed on the interconnect structure 120 and over the semiconductor substrate 110, and sidewalls of the conductive vias 140 are wrapped around by the passivation layer 130. In some embodiments, as shown in FIG. 1, the conductive vias 140 each penetrate through the passivation layer 130 and extend into the openings O1 formed in the outermost layer of the inter-dielectric layers 122 to physically contact the surface of the outermost layer of the patterned conductive layers 124 exposed by the openings O1. Through the interconnect structure 120, the conductive vias 140 are electrically connected to the active components and/or passive components included in the semiconductor substrate 110. In some embodiments, the conductive vias 140 in physical contact with the interconnect structure 120 are extended away from the surface 130a of the passivation layer 130. For simplification, only two conductive vias 140 are presented in FIG. 1 in each semiconductor die 10 for illustrative purposes, however it should be noted that more than two conductive vias 140 may be formed; the disclosure is not limited thereto.

In some embodiments, the conductive vias 140 are formed by photolithography, plating, photoresist stripping processes or any other suitable method. The plating process may include an electroplating plating, an electroless plating, or the like. For example, the conductive vias 140 is formed by, but not limited to, forming a mask pattern (not shown) covering the passivation layer 130 with openings (not shown) corresponding to the surface of the outermost layer of the patterned conductive layers 124 exposed by the openings O1, patterning the passivation layer 130 to form contact openings (not shown) therein to expose the surface of the outermost layer of the patterned conductive layers 124 exposed by the openings O1, forming a metallic material filling the openings formed in the mask pattern, the contact openings formed in the passivation layer 130 and the openings O1 to form the conductive vias 140 by electroplating or deposition, and then removing the mask pattern. The passivation layer 130 may be patterned by an etching process, such a dry etching process, a wet etching process, or the combination thereof. It is noted that, for example, the contact openings formed in the passivation layer 130 and a respective one opening O1 underlying thereto are spatially communicated to each other for the formation of the conductive vias 140. The mask pattern may be removed by acceptable ashing process and/or photoresist stripping process, such as using an oxygen plasma or the like. In one embodiment, the material of the conductive vias 140 includes a metal material such as copper or copper alloys, or the like.

In some embodiments, in a vertical projection on the frontside surface 110a of the semiconductor substrate 110 along a stacking direction Z of the semiconductor substrate 110, the interconnect structure 120 and the passivation layer 130, the conductive vias 140 may, independently, be in a circle-shape, an ellipse-shape, a triangle-shape, a rectangle-shape, or the like. The shape of the conductive vias 140 is not limited in the disclosure. The number and shape of the conductive vias 140 may be designated and selected based on the demand, and adjusted by changing the number and shape of the contact openings formed in the passivation layer 130.

Alternatively, the conductive vias 140 may be formed by forming a first mask pattern (not shown) covering the passivation layer 130 with openings (not shown) corresponding to the surface of the outermost layer of the patterned conductive layers 124 exposed by the openings O1, patterning the passivation layer 130 to form the contact openings (not shown) therein to expose the surface of the outermost layer of the patterned conductive layers 124 exposed by the openings O1, removing the first mask pattern, conformally forming a metallic seed layer over the passivation layer 130, forming a second mask pattern (not shown) covering the metallic seed layer with openings (not shown) exposing the contact openings formed in the passivation layer 130 and the openings O1, forming a metallic material filling the openings formed in the second mask pattern, the contact openings formed in the passivation layer 130 and the openings O1 by electroplating or deposition, removing the second mask pattern, and then removing the metallic seed layer not covered by the metallic material to form the conductive vias 140. In some embodiments, the metallic seed layer is referred to as a metal layer, which includes a single layer or a composite layer comprising a plurality of sub-layers formed of different materials. In some embodiments, the metallic seed layer includes titanium, copper, molybdenum, tungsten, titanium nitride, titanium tungsten, combinations thereof, or the like. For example, the metallic seed layer may include a titanium layer and a copper layer over the titanium layer. The metallic seed layer may be formed using, for example, sputtering, physical vapor deposition (PVD) or the like.

In some embodiments, for the semiconductor die 10, a sidewall of the semiconductor substrate 110, a sidewall of the interconnect structure 120 and a sidewall of the passivation layer 130 are substantially aligned with each other in the direction Z. For example, illustrated outermost surface of the conductive vias 140 are protruding away from (e.g. not aligned with) the surface 130a of the passivation layer 130, as shown in FIG. 1. Alternatively, illustrated outermost surface of the conductive vias 140 are substantially leveled to and coplanar with (e.g. aligned with) the surface 130a of the passivation layer 130.

It is appreciated that, in some embodiments, the semiconductor die 10 described herein may be referred to as a semiconductor chip or an integrated circuit (IC). In some embodiments, the semiconductor die 10 is a logic chip, such as a central processing unit (CPU), a graphics processing unit (GPU), a system-on-a-chip (SoC), a system-on-integrated-circuit (SoIC), a microcontroller, or the like. However, the disclosure is not limited thereto; alternatively, the semiconductor die 10 may include a digital chip, an analog chip or a mixed signal chip, such as an application-specific integrated circuit ("ASIC") chip, a sensor chip, a wireless and radio frequency (RF) chip, a baseband (BB) chip, a memory chip (such as high bandwidth memory (HBM) dies) or a voltage regulator chip. In further alternative embodiments, the semiconductor die 10 can be a chip or an IC of combination-type, such as a WiFi chip simultaneously including both of a RF chip and a digital chip.

In some embodiments, as shown in FIG. 1, each of the semiconductor dies 20 described herein may be referred to as a semiconductor chip or an integrated circuit (IC) having conductive vias 22, where the conductive vias 22 serve as conductive terminals of the semiconductor dies 20 for electrical connection to external components. In some embodiments, the semiconductor dies 20 each are a memory chip or device, such as a dynamic random access memory (DRAM) die, static random access memory (SRAM) die, hybrid memory cube (HMC) module, a high bandwidth memory (HBM) module, or the like. In the disclosure, the type of the semiconductor die(s) 10 are different from the type of the semiconductor dies 20.

Continued on FIG. 1, in some embodiments, the semiconductor dies 10, 20 are bonded to the interposer 300, where the interposer 300 includes a substrate 310, a plurality of through vias 320 in the substrate 310, a redistribution circuit structure 340 located on the substrate 310 and connected to the through vias 320, a plurality of conductive connectors 360 connected to the redistribution circuit structure 340, and a plurality of conductive connectors 380 connected to the through vias 320. For example, the semiconductor dies 10, 20 are picked and placed on the interposer 300, and are bonded to the interposer 300 by flip-chip bonding.

In some embodiments, the substrate 310 is a wafer, such as a bulk semiconductor substrate, SOI substrate, multi-layered semiconductor substrate, or the like. The semiconductor material of the substrate 310 may be silicon, germanium; a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof, in some embodiments. In an alternative embodiment, other substrates, such as multi-layered or gradient substrates, may also be used. The substrate 310 may be doped or undoped and may further include active and/or passive devices, such as transistors, capacitors, resistors, diodes, and the like formed in and/or on a surface 310a of the substrate 310. In some embodiments, the surface 310a is referred to as an active surface (or a front side) of the substrate 310. In certain embodiments, the substrate 310 are substantially free of active and/or passive devices, the disclosure is not limited thereto.

In some embodiments, through vias 320 are formed in the substrate 310 to extend from the surface 310a of the substrate 310 to a surface 310b of the substrate 310, where the surface 310b is opposite to the surface 310a along the stacking direction Z. For example, the surface 310b is referred to as a backside surface (or a back side) of the substrate 310, and the through vias 320 are sometimes referred to as through-substrate-vias or through-silicon-vias as the substrate 310 is a silicon substrate. The through vias 320 may be formed by forming recesses in the substrate 310 (by, for example, etching, milling, laser techniques, a combination thereof, and/or the like) and depositing a conductive material in the recesses. The conductive material may be formed by an electro-chemical plating process, chemical vapor deposition (CVD), atomic layer deposition (ALD), PVD, a combination thereof, and/or the like. Examples of conductive materials are copper, tungsten, aluminum, silver, gold, a combination thereof, and/or the like. A thin dielectric material may be formed in the recesses, such as by using an oxidation technique, to separate the substrate 310 and the through vias 320. A thin barrier layer may be conformally formed in the recesses, such as by CVD, ALD, PVD, thermal oxidation, a combination thereof, and/or the like, to separate the substrate 310 and the t thin dielectric material. The barrier layer may comprise a nitride or an oxynitride, such as titanium nitride, titanium oxynitride, tantalum nitride, tantalum oxynitride, tungsten nitride, a combination thereof, and/or the like. Excess conductive material and barrier layer is removed from the surface 310a of the substrate 310 by, for example, chemical mechanical polishing (CMP) process. Thus, the through vias 320 may comprise a conductive material and a thin barrier layer between the conductive material and the substrate 310.

In some embodiments, a redistribution circuit structure 340 is formed on the surface 310a of the substrate 310, and is electrically connected to the substrate 310. In certain embodiments, the redistribution circuit structure 340 includes a dielectric structure 342 and one or more metallization layers 344 arranged therein for providing routing functionality. In some embodiments, the dielectric structure 342 includes one or more dielectric layers, such that the dielectric layers and the metallization layer 344 are sequentially formed, and one metallization layer 344 is sandwiched between two dielectric layers. As shown in FIG. 1, portions of a top surface of a topmost layer of the metallization layers 344 are respectively exposed by openings formed in a topmost dielectric layer of the dielectric structure 342, and portions of a bottom surface of a bottommost layer of the metallization layers 344 are respectively exposed by openings formed in a bottommost dielectric layer of the dielectric structure 342. However, the disclosure is not limited thereto. The numbers of the metallization layers and the dielectric layers included in the redistribution circuit structure 340 is not limited thereto, and may be designated and selected based on the demand. The material and formation of the dielectric structure 342 may be the same or similar to the material and formation of the inter-dielectric layers 122, the material and formation of the metallization layers 344 may be the same or similar to the material and formation of the patterned conductive layers 124, and thus may not be repeated herein.

As shown in FIG. 1, the through vias 320 are connected to the portions of the bottom surface of the bottommost layer of the metallization layers 344 respectively exposed by the openings formed in the bottommost dielectric layer of the dielectric structure 342. In other words, the redistribution circuit structure 340 are electrically connected to the through vias 320. The redistribution circuit structure 340 may further be electrically connected to the active and/or passive devices embedded in the substrate 310 or formed on the surface 310a of the substrate 310 (if any). In some embodiments, through the redistribution circuit structure 340, the through vias 320 are electrically coupled to the substrate 310 and/or the active and/or passive devices embedded in the substrate 310 or formed on the surface 310a of the substrate 310 (if any).

In some embodiments, the interposer further includes a plurality of conductive connectors 360 on the redistribution circuit structure 340. As shown in FIG. 1, for example, the conductive connectors 360 are formed on and connected to the portions of the top surface of the topmost layer of the metallization layers 344 respectively exposed by the openings formed in the topmost dielectric layer of the dielectric structure 342. In other words, the conductive connectors 360 are electrically connected to the redistribution circuit structure 340. In an alternative embodiment, through the redistribution circuit structure 340, some of the conductive connectors 360 may further be electrically connected to the substrate 310 (e.g. the active and/or passive devices embedded therein or formed on the surface 310a) and the through vias 320. As illustrated in FIG. 1, the semiconductor die 10 is bonded to the interposer 300 by connecting the conductive vias 140 and some of the conductive connectors 360, and the semiconductor dies 20 are bonded to the interposer 300 by connecting the conductive terminals 22 and some of the conductive connectors 360, for example. In some embodiments, the semiconductor die 10 and the semiconductor dies 20 are electrically coupled and electrically communicated to each other through the interposer 300.

In some embodiments, the conductive connectors 360 may include ball grid array (BGA) connectors, solder balls, metal pillars, controlled collapse chip connection (C4) bumps, micro bumps, electroless nickel-electroless palladium-immersion gold technique (ENEPIG) formed bumps, or the like. The material of the conductive connectors 360, for example, may include a conductive material such as solder, copper, aluminum, gold, nickel, silver, palladium, tin, or the like, or a combination thereof. In one embodiment, the material of the conductive connectors 360, for example, may be solder-free. The cross-sectional view of the conductive connectors 360 is not limited to the embodiments, and may has any suitable shape based on the demand.

In some embodiments, a plurality of conductive connectors 380 are formed on the substrate 310, where the conductive connectors 380 are connected to the through vias 320. As shown in FIG. 1, the conductive connectors 380 are formed on the substrate 310 corresponding to the positioning location of the through vias 320, and thus the conductive connectors 380 are in physical contact with the bottom surfaces 320b of the through vias 320, respectively, for example. In some embodiments, through the through vias 320, the redistribution circuit structure 340 and the conductive connectors 360, some of the conductive connectors 380 are electrically connected to the semiconductor dies 10. In some embodiments, through the through vias 320, the redistribution circuit structure 340 and the conductive connectors 360, some of the conductive connectors 380 are electrically connected to the semiconductor dies 20. In an alternative embodiment, some of the conductive connectors 380 may further be electrically connected to the active and passive devices embedded in or formed on the surface 310a of the substrate 310. The material and formation of the conductive connectors 380 are the same or similar to the material and formation of the conductive connectors 360, and thus may not be repeated herein. In one embodiment, the conductive connectors 380 may be the same as the conductive connectors 360. In an alternative embodiment, the conductive connectors 380 may be different from the conductive connectors 360. In the disclosure, the conductive connectors 360 and 380 each are referred to as conductive terminals of the interposer 300 for electrical connection with other components.

However, the disclosure is not limited thereto, alternatively, the interposer 300 may optionally include an additionally redistribution circuit structure on the surface 310b of the substrate to electrically connect the through vias 320 and the conductive connectors 380 for further routing functionality.

Continued on FIG. 1, in some embodiments, an underfill UF1 at least fills the gaps between the semiconductor die 10 and the interposer 300 (e.g. the redistribution circuit structure 340) and between the semiconductor dies 20 and the interposer 300 (e.g. the redistribution circuit structure 340), and wraps sidewalls of the conductive vias 140, the conductive vias 22 and the conductive connectors 360. In one embodiment, the underfill UF1 filled in the gaps between the semiconductor dies 10, 20 and the redistribution circuit structure 340 are not connected to one another. In another embodiment, the underfill UF1 filled in the gaps between the semiconductor dies 10, 20 and the redistribution circuit structure 340 are connected to one another, the disclosure is not limited thereto. For example, a sidewall of the semiconductor die 10 and a sidewall of each of the semiconductor dies 20 is free of the underfill UF1, as shown in FIG. 1; however, the disclosure is not limited thereto. Alternatively, the sidewall of the semiconductor die 10 and the sidewall of each of the semiconductor dies 20 may be covered by the underfill UF1. The underfill UF1 may be any acceptable material, such as a polymer, epoxy resin, molding underfill, or the like, for example. In one embodiment, the underfill UF1 may be formed by underfill dispensing, a capillary flow process, or any other suitable method.

In some embodiments, the semiconductor dies 10, 20 are encapsulated in the insulating encapsulation 400, and the redistribution circuit structure 340 exposed by the underfill UF1 is covered by the insulating encapsulation 400. For example, the insulating encapsulation 400 at least fills up the gaps between the semiconductor dies 10, 20 and between the underfill UF1 respectively underlying the semiconductor dies 10, 20. As shown in FIG. 1, for example, the semiconductor dies 10, 20 and the underfill UF1 are surrounded and covered by the insulating encapsulation 400. That is, the semiconductor dies 10, 20 and the underfill UF1 are embedded in the insulating encapsulation 400. As shown in FIG. 1, in some embodiments, the backside surface 110b of the semiconductor die 10 and surfaces 20b (e.g. nonactive surfaces) of the semiconductor dies 20 are substantially levelled with and coplanar to an illustrated top surface 400t of the insulating encapsulation 400.

In some embodiments, the insulating encapsulation 400 is a molding compound formed by a molding process. In some embodiments, the insulating encapsulation 400, include polymers (such as epoxy resins, phenolic resins, silicon-containing resins, or other suitable resins), dielectric materials, or other suitable materials. In an alternative embodiment, the insulating encapsulation 400m may include an acceptable insulating encapsulation material. The insulating encapsulation 400 may further include inorganic filler or inorganic compound (e.g. silica, clay, and so on) which can be added therein to optimize coefficient of thermal expansion (CTE) of the insulating encapsulation 400, the disclosure is not limited thereto. For example, the insulating encapsulation 400 is formed by, but not limited to, over-molding the semiconductor dies 10, 20 by an insulating encapsulation material, and patterning the insulating encapsulation material to form the insulating encapsulation 400. The insulating encapsulation material may be patterned by a planarizing process until the semiconductor dies 10 and 20 are accessibly exposed by the insulating encapsulation 400. However, the disclosure is not limited thereto; alternatively, the backside surface 110b of the semiconductor die 10 and surfaces 20b (e.g. nonactive surfaces) of the semiconductor dies 20 may be embedded in the insulating encapsulation 400 (e.g. not revealed by the substantially flat and planar illustrated top surface 400t of the insulating encapsulation 400).

During the planarizing process, the semiconductor dies 10, 20 independently may also be planarized. The planarizing process is performed by mechanical grinding or CMP, for example. After the planarizing process, a cleaning process may be optionally performed to clean and remove the residue generated from the planarizing process. However, the disclosure is not limited thereto, and the planarizing process may be performed through any other suitable method.

In some embodiments, for the semiconductor device 1000A, a sidewall of the interposer 300 and a sidewall of the insulating encapsulation 400 are substantially aligned with each other in the direction Z. In some embodiments, the semiconductor dies 20 are arranged aside of the semiconductor die 10 on a X-Y plane in a direction X, as shown in FIG. 1 and FIG. 5. However, the disclosure is not limited thereto; alternatively, the semiconductor dies 20 may be arranged aside of the semiconductor die 10 on the X-Y plane in a direction Y or in the directions X and Y. The directions X and Y are different form each other and each are different from direction Z, in some embodiments. The directions X and Y may be perpendicular to each other and each may be perpendicular to the direction Z.

Figure 2:
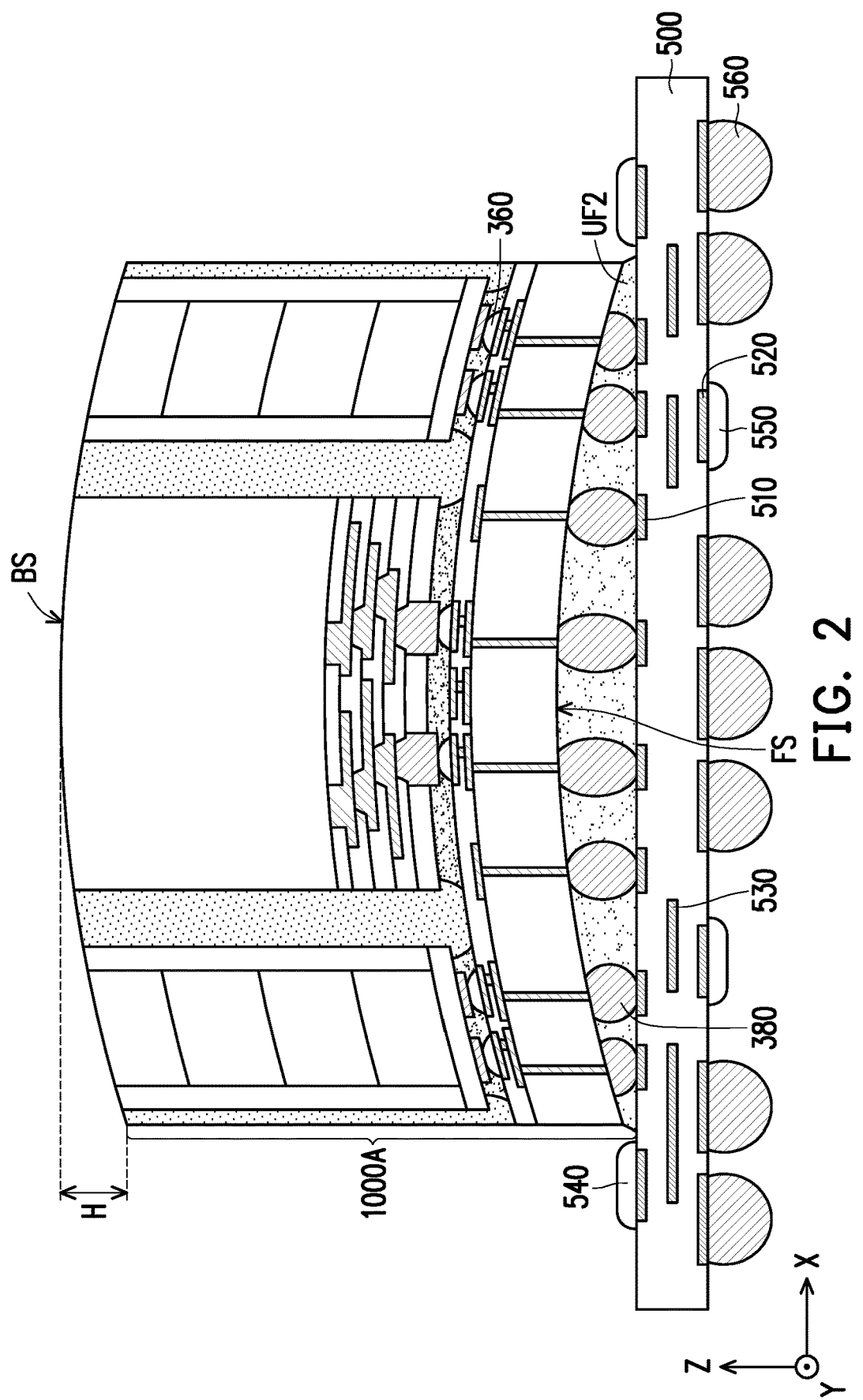

Referring to FIG. 2, in some embodiments, the semiconductor device 1000A is placed over a substrate and bonded to the substrate 500 through the conductive connectors 380. The substrate 500 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In some alternative embodiments, the substrate 500 is a SOI substrate, where the SOI substrate may include a layer of a semiconductor material such as epitaxial silicon, germanium, silicon germanium, SOI, silicon germanium on insulator (SGOI), or combinations thereof. In further alternative embodiments, the substrate 500 is based on an insulating core, such as a fiberglass reinforced resin core. One example core material is fiberglass resin such as flame retardant class 4 (FR4). Alternatives for the core material may include bismaleimide triazine (BT) resin, or alternatively, other printed circuit board (PCB) materials or films. In yet further alternative embodiments, the substrate 500 is a build-up film such as Ajinomoto build-up film (ABF) or other suitable laminates.

In one embodiment, the substrate 500 may include active and/or passive devices (not shown), such as transistors, capacitors, resistors, combinations thereof, or the like which may be used to generate the structural and functional requirements of the design for the semiconductor package. The active and/or passive devices may be formed using any suitable methods. However, the disclosure is not limited thereto; in an alternative embodiment, the substrate 500 may be substantially free of active and/or passive devices.

In some embodiments, the substrate 500 includes metallization layers 530 and vias (not shown) interconnected therebetween and bonding pads 510, 520 connected to the metallization layers 530 and vias. The metallization layers 530 and vias together form a functional circuitry providing routing for the substrate 500. The metallization layers 530 and vias embedded in the substrate 500 may be formed of alternating layers of dielectric (e.g. low-k dielectric material) and conductive material (e.g., copper) with vias interconnecting the layers of conductive material and may be formed through any suitable process (such as deposition, damascene, dual damascene, or the like). The bonding pads 510, 520 are used to provide electrical connection with external component(s) for the substrate 500. In some embodiments, the bonding pads 510, 520 are located at two opposite sides of the substrate 500 along the direction Z and electrically connected to each other through the metallization layers 530 and vias. As shown in FIG. 2, for example, the conductive connectors 380 of the semiconductor device 1000A are connected to the bonding pads 510 of the substrate 500, respectively. As shown in FIG. 2, in some embodiments, through bonding pads 510 and the conductive connectors 380, the semiconductor device 1000A is electrically connected to the substrate 500. In addition, the substrate 500 is considered as a circuit structure (e.g. an organic substrate with circuitry structure embedded therein, such as printed circuit board (PCB)).

In some embodiments, conductive connectors 560 may be optionally disposed on a bottom surface of substrate 500, as shown in FIG. 2. The conductive connectors 560 may be used to physically and electrically connect the substrate 500 to other devices, packages, connecting components, and the like. The conductive connectors 560 are referred to as conductive terminals of the substrate 500 for providing physical and/or electrical connection to external components, in the disclosure. As shown in FIG. 2, the conductive connectors 560 and the semiconductor device 1000A are respectively located on two opposite sides of the substrate 500, where some of the conductive connectors 560 are electrically connected to the semiconductor device 1000A through the bonding pads 520, the metallization layers 530 and vias, the bonding pads 510 and the conductive connectors 380.

In some embodiments, one or more surface devices 540, 550 may be optionally connected to the substrate 500. The surface devices 540, 550 may be, for example, used to provide additional functionality or programming to the semiconductor device 1000A. The surface devices 540, 550 may include surface mount devices (SMDs) or an integrated passive devices (IPDs) that comprise passive devices such as resistors, inductors, capacitors, jumpers, combinations of these, or the like that are desired to be connected to and utilized in conjunction with the semiconductor device 1000A.

For example, as shown in FIG. 2, the surface devices 540 is placed on the surface of the substrate 500 where the semiconductor device 1000A disposed thereon, and the surface devices 550 is placed on the surface of the substrate 500 where the conductive connectors 560 disposed thereon. The number of the surface devices 540 and the number of the surface devices 550 are not limited to the embodiment, and may be selected based on the demand and design layout. The disclosure is not limited thereto. In one embodiment, only the surface devices 540 are formed on the substrate 500, where the number of the surface devices 540 may be one or more than one. In an alternative embodiment, only the surface devices 550 are formed on the substrate 500, where the number of the surface devices 550 may be one or more than one. As shown in FIG. 2, the surface devices 540, 550 are electrically connected to the semiconductor device 1000A through the bonding pads 510, 520, the metallization layers 530 and vias, and the conductive connectors 380.

In some embodiments, an underfill UF2 is formed on the substrate 500. As shown in FIG. 2, for example, the underfill UF2 fills the gap between the semiconductor device 1000A and the substrate 500, and wraps sidewalls of the conductive connectors 380. The material and formation of the underfill UF2 may be the same or similar to the material and formation of underfill UF1 as described in FIG. 1, and thus are not repeated herein for simplicity.

Referring to FIG. 1 and FIG. 2 together, as a result of the manufacturing process, warping of the semiconductor device 1000A shown in FIG. 2 may occur. For example, the warpage occurs due to mismatch of the CTE between materials, application of heat, temperature fluctuations, and/or the like. It is understood that the warpage of structure may adversely impact the electrical performance of the devices/circuits formed in the semiconductor device 1000A, and the warpage issue may affect subsequent processing and/or product reliability. For example, the bowing of the semiconductor device 1000A causes the semiconductor device 1000A having a convex warpage (i.e. crying profile) in respect with the conductive connectors 380, where a surface BS of the semiconductor device 1000A bows downwards from the center of the semiconductor device 1000A to the periphery of the semiconductor device 1000A, as illustrated in FIG. 2. In some embodiments, a height difference H in a surface BS (e.g., the surface opposite to the conductive connectors 380) of the semiconductor device 1000A under the warping is approximately ranging about 30 μm to about 150 μm. In the examples described above, the warpage of the semiconductor device 1000A may be symmetrical. However, the disclosure is not limited thereto, alternatively, the warpage of the semiconductor device 1000A may be asymmetrical.

In some embodiments, due to the height differences in the gap between a surface FS (e.g., the surface disposed with the conductive connectors 380) of the semiconductor device 1000A and the substrate 500 under the warping, the volumes of the conductive connectors 380 are controlled to ensure the bonding between the semiconductor device 1000A and the substrate 500. For example, some conductive connectors 380 are disposed at a location where the gap having a first height, and some conductive connectors 380 disposed at a location where the gap having a second height less than the first height, where the conductive connectors 380 disposed at the location where the gap having the first height have a volume greater than the conductive connectors 380 disposed at the location where the gap having the second height. By controlling the volumes of the conductive connectors 380, the reliability in the bonding between the semiconductor device 1000A and the substrate 500 is enhanced.

Figure 3:
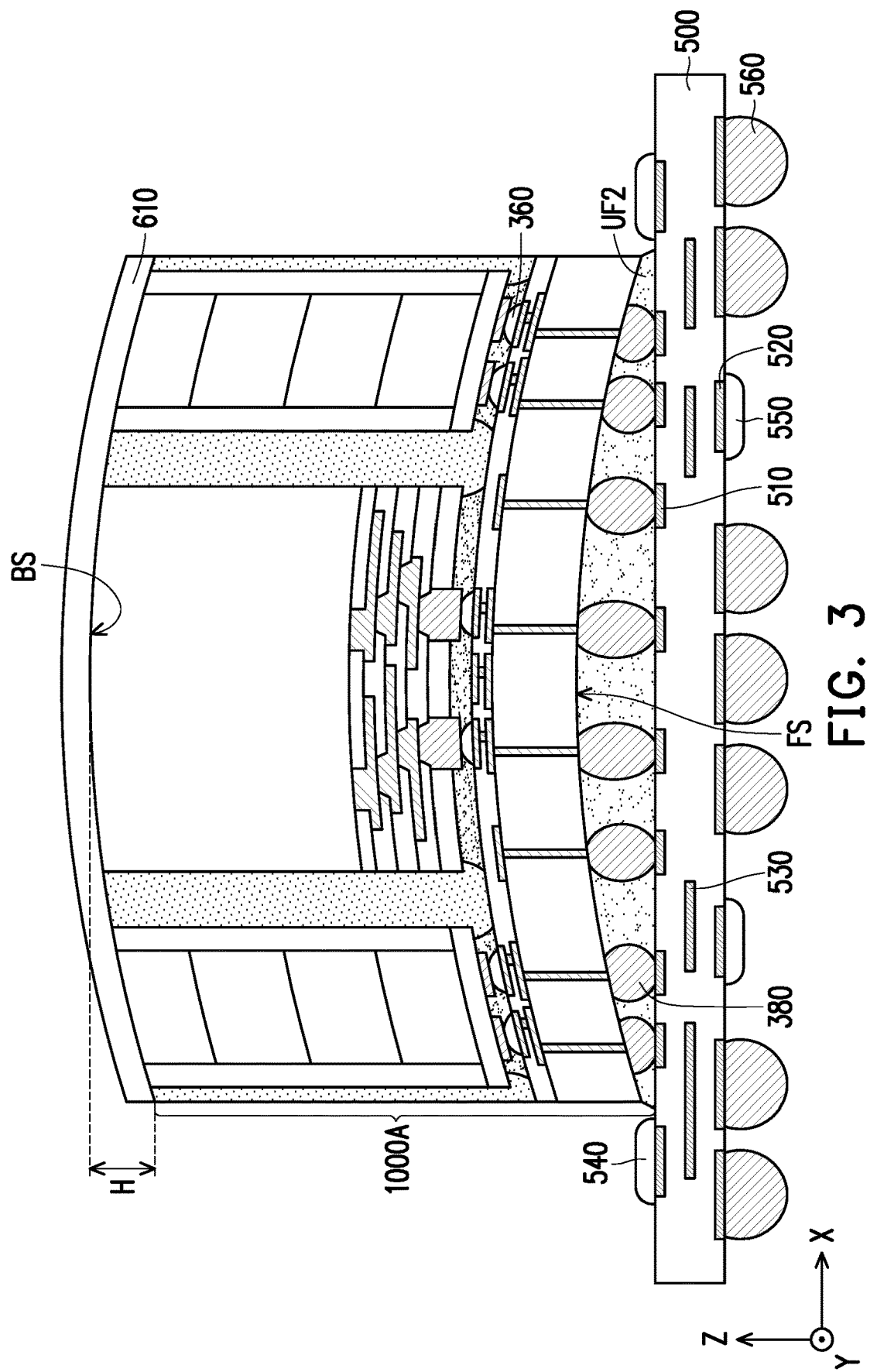

Referring to FIG. 3, in some embodiments, a thermal interface material 610 is applied on the surface BS of the semiconductor device 1000A. For example, the thermal interface material 610 is thermally coupled to the semiconductor device 1000A, which further helps to dissipate heat from the semiconductor device 1000A to a heat dissipating element later-formed thereon. The thermal interface material 610 may include any suitable thermally conductive material such as a polymer having a good thermal conductivity, which may be between about 3 W/m·K to about 10 W/m·K or more. In some embodiments, the thermal interface material 610 is a film type thermal interface material, such as graphene sheet, carbon nanotube sheet or the like, and is formed on the surface BS of the semiconductor device 1000A by lamination or the like. The disclosure does not specifically limit a thickness of the thermal interface material 610 as long as the thermal interface material 610 is thick enough to sufficiently dissipating heat from the semiconductor device 1000A to the later-formed heat dissipating element.

Figure 4:
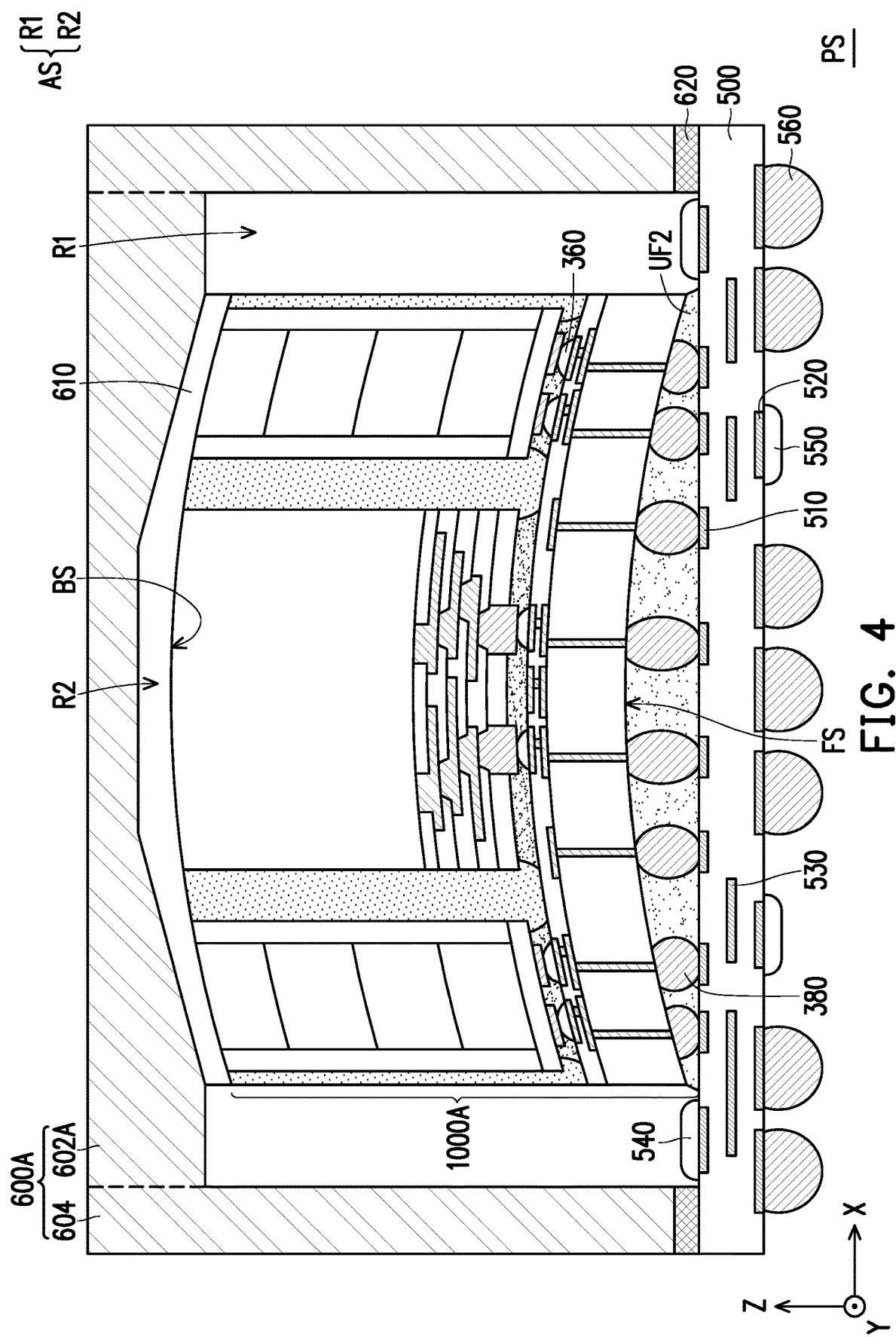

Referring to FIG. 4, in some embodiments, a heat dissipating lid 600A is provided and bonded to the substrate 500 to form a package structure PS. In some embodiments, the heat dissipating lid 600A is attached to the substrate 500 using a bonding element 620. In other words, the heat dissipating lid 600A is bonded to the substrate 500 by connecting the flange portion 604 to the substrate 500 through the boding element 620. In some embodiments, the bonding element 620 is formed in a manner of a continuous pad having an annular shape located on the substrate 500, where the bonding element 620 is disposed on the substrate 500 where only the flange portion 604 is expected to contact the substrate 500. For example, the closed frame shape of the bonding element 620 corresponds to the shape of the flange portion 604. The closed frame shape of the bonding element 620 may be in a circular, a rectangular, ellipse, or polygonal form.

A material of the bonding element 620 is not particularly limited, and may be chosen as a function of a material used for adhering the substrate 500 and the heat dissipating lid 600A (e.g. the flange portion 604), where the bonding element 620 has to secure the substrate 500 and the heat dissipating lid 600A together. For example, a material of the bonding element 620 includes a thermo-curable adhesive, photocurable adhesive, thermally conductive adhesive, thermosetting resin, waterproof adhesive, lamination adhesive or a combination thereof. In some embodiments, the material of the bonding element 620 includes a thermally conductive adhesive. For another example, the bonding element 620 includes a die attach film (DAF). According to the type of material used, the bonding element 620 may be formed by deposition, lamination, printing, plating, or any other suitable technique. In certain embodiments, depending on the material of the bonding element 620, the substrate 500 may be thermally coupled to heat dissipating lid 600A through the bonding element 620. For example, as shown in FIG. 4, the semiconductor device 1000A is arranged within an inner cavity (e.g. an accommodating space AS) confined by the heat dissipating lid 600A and the substrate 500. Up to here, the package structure PS is manufactured. In some embodiments, for the package structure PS, the heat dissipating lid 600A provides physical protection to the semiconductor device 1000A in addition to the functionality of dissipating heat. The heat dissipating lid 600A, for example, has a high thermal conductivity between about 200 W/m·K to about 400 W/m·K or more, and is formed using a metal, a metal alloy, and the like.

In some embodiments, as illustrated in FIG. 4, the heat dissipating lid 600A includes a cover portion 602A and a flange portion 604 at the periphery of the cover portion 602A, in some embodiments. In some embodiments, the cover portion 602A is disposed over the semiconductor device 1000A and extends substantially parallel to the substrate 500. In some embodiments, the flange portion 604 is disposed beside (aside of) the semiconductor device 1000A and located at an edge of the cover portion 602A, and projected towards the substrate 500. In some embodiments, the flange portion 604 extends in a direction perpendicular to the plane defined by the cover portion 602A. For example, the flange portion 604 is in contact with the edge of the cover portion 602A. In some embodiments, the flange portion 604 and the cover portion 602A describe a right angle at their joint, but the disclosure is not limited thereto. Alternatively, the flange portion 604 may be joined to the cover portion 602A at different angles than 90 degrees. In some embodiments, as illustrated in FIG. 4, the semiconductor device 1000A is surrounded by (and distant from) the flange portion 604, and is connected to the cover portion 602A through the thermal interface material 610. For example, the heat dissipating lid 600A is thermally coupled to the semiconductor device 1000A through the thermal interface material 610.

Referring to FIG. 4 and FIG. 5 in conjunction with FIG. 6 through FIG. 7, where only the floor plan of the heat dissipating lid 600A is stressed in the floor plan (e.g. a top view) of FIG. 6 and a cross-section of the heat dissipating lid 600A is stressed in the cross-sectional view of FIG. 7 for illustration purposes and easy illustration. The cover portion 602A may present a region (e.g. P1) without recess and a region (e.g. P2) with a recess. For example, as shown in FIG. 4 through FIG. 7, when laterally extending over the substrate 500, the cover portion 602A presents at least one region P1 of a thickness T602 (as measured along the direction Z) having no recesses and at least one region P2 of a thickness T1 (as measured along the direction Z) having a recess (e.g. R2). In some embodiments, the region P2 of the thickness T1 (which is smaller than the thickness T602) defines a recess R2 over the semiconductor device 1000A. For example, the cover portion 602A has an outer surface S1 and an inner surface S2 opposite to the outer surface S1 along the direction Z, where the recess R2 is located in the cover portion 602A at the region P2 and protruded from a plane (indicated by a dash-dotted line in FIG. 7) defined by the inner surface S2 at the region P1 towards the outer surface S1. In some embodiments, the recess R2 has an opening at the inner surface S2 (in region P2) and penetrates a portion of the cover portion 602A, where the recess R2 is not revealed from the outer surface S1 of the cover portion 602A. For example, the recess R2 is formed in the cover portion 602A through milling machining, stamping process (with a mold), wire electrical discharge machining (EDM), or the like. In some embodiments, a positioning location (e.g. the region P2) of the recess R2 in the cover portion 602A is corresponding to a positioning location of the semiconductor device 1000A, in some embodiments. For example, as shown in FIG. 4 and FIG. 5, the positioning location of the recess R2 is overlapped with the positioning location of the semiconductor device 1000A in the direction Z. In certain embodiments, the positioning location of the recess R2 is completely overlapped with the positioning location of the semiconductor device 1000A in the direction Z.

In some embodiments, the plane defined by the inner surface S2 at the region P1, an inner sidewall S3 of the flange portion 604 and the substrate 500 together confine a recess RE where the recess R1 and the recess R2 are spatially communicated to each other, as illustrated in FIG. 4. That is, for example, the recess R1 and the recess R2 together constitute the accommodating space AS for accommodating the semiconductor device 1000A.

In some embodiments, the outer surface S1 of the cover portion 602A is a continuous planar plane as laterally extending over the regions P1 and P2; on the other hand, the inner surface S2 of the cover portion 602A is a non-planar surface, where the inner surface S2 of the cover portion 602A has a planar surface as laterally extending over the region P1 and is a non-planar surface as laterally extending over the region P2. For example, the region P1 surrounds and is adjoined to a periphery of the region P2 in the top view of the heat dissipating lid 600A depicted in FIG. 6. In some embodiments, the region P1 is in a manner of a continuous pattern having an annular shape surrounding the region P2. The annular shape of the region P1 corresponds to the shape of the region P2, and thus is not specifically limited in the disclosure. In other word, the region P2 of the cover portion 602A is distant from the flange portion 604 through the region P1 of the cover portion 602A along the X-Y plane, see FIG. 6.

In the disclosure, a profile of the recess R2 in the cross section of the heat dissipating lid 600A corresponds to the layout (e.g. an arrangement of the semiconductor dies 10, 20) of the semiconductor device 1000A, in some embodiments. For example, as illustrated in the cross-sectional views of FIG. 4, FIG. 5 and FIG. 7, in the cross section of the heat dissipating lid 600A, the recess R2 includes a predetermined pattern corresponding to the semiconductor device 1000A being bent upwards due to warpage. For example, the warping of the semiconductor device 1000A occurs at locations having the CTE mismatch, such as the locations between the semiconductor die 10 and the semiconductor dies 20 (which are referred to as the warping locations and indicated by lines BL1 and BL2 depicted in the schematic explosive view of FIG. 5) and the location at the boundaries between the semiconductor die 10 and the insulating encapsulation 400 and between the semiconductor dies 20 and the insulating encapsulation 400. With the warping locations BL1 and BL2, the recess R2 may have the predetermined pattern of included angles corresponding to the locations having the CTE mismatch. For example, as shown in FIG. 5 and FIG. 7, along the stacking direction Z, the recess R2 includes the predetermined pattern having an included angle θ1 corresponding to (e.g. being positioned to be aligned to) the warping location BL1 and an included angle θ2 corresponding to (e.g. being positioned to be aligned to) the warping location BL2. In some embodiments, the included angles θ1 and θ2 each have a non-rounded included angle (e.g., with sharp tips, see FIGS. 4 and 7) or rounded included angle (not shown) being greater than about 90° (degrees) and less than about 180°. In other words, each of the included angles θ1 and θ2 of the recess R2 is located over at the locations (e.g. BL1 or BL2) between one group G10 (involving only the semiconductor die 10) and one group G20 (involving only the semiconductor dies 20) of the semiconductor device 1000A, in which such location (BL1 or BL2) is where the warping of the semiconductor device 1000A most likely occur during the manufacture of the semiconductor device 1000A. Due to the predetermined pattern of the recess R2 corresponding to the contour of the semiconductor device 1000A undergoing warpage, the engagement between the cover portion 602A of the heat dissipating lid 600A and the semiconductor device 1000A disposed with the thermal interface material 610 is greatly improved, thereby a coverage of the thermal interface material 610 in the package structure PS is significantly increased (e.g. reaching to about 90% to 100%).

In some embodiments, as shown in FIG. 5 through FIG. 7, in the region P2 (including sub-portions P10 and P20) of the cover portion 602A, the sub-portions P20 of the region P2 corresponding to locations of the semiconductor dies 20 (e.g. the groups G20) each have a width W20 substantially being equal to the width of the semiconductor dies 20 underlying thereto, and the sub-portion P10 of the region P2 corresponding to a location of the semiconductor die 10 (e.g. the group G10) has a width W10 substantially being equal to the width of the semiconductor die 10 underlying thereto. The width W20 of the sub-portions P20 may be greater than about 6 mm (millimeter), and the width W10 of the sub-portions P10 may be greater than about 10 mm. In addition, in the region P1 of the cover portion 602A, the region P1 has a width W1 greater than 0 mm to separate the semiconductor device 1000A from the flange portion 604, however the disclosure is not limited the widths W1, W10 and W20, where the widths W1, W10 and W20 may be selected and designated based on the demand and design requirement of the package structure PS and the design layout of the semiconductor device 1000A. For example, a width W2 of the recess R2 is equal to a value of W10+(W20)*2, and a width W0 of the recess R1 is equal to a value of (W1)*2+W2. In some embodiments, the recess R2 has a depth Ta approximately ranging from 50 μm to 100 μm, and the depth Ta is less than the thickness T602. As shown in FIG. 6 and FIG. 7, for example, the sub-portions P20 are arranged next to the sub-portion P10 and connected to the sub-portion P10 at two opposite sides thereof. In some embodiments, an arrangement of the sub-portions P10 and P20 of the recess R2 is corresponding to an arrangement of the groups G10 and 20 of the semiconductor device 1000A. For example, a positioning location of the semiconductor die 10 (e.g. one G10) is within a positioning location of the sub-portion P10 in a vertical projection on the substrate 500 along the direction Z. In some embodiments, on the X-Y plane (projecting in direction Z), the size of a projection area of the sub-portion P10 is greater than the size of a projection area of the group G10 of the semiconductor die 10. On the other hand, a positioning location of the semiconductor dies 20 (e.g. one G20) is within a positioning location of a respective one sub-portion P20 in a vertical projection on the substrate 500 along the direction Z. In some embodiments, on the X-Y plane (projecting in direction Z), the size of a projection area of each of the sub-portion P20 is greater than the size of a projection area of each group G20 of the semiconductor dies 20.

It is appreciated that a depth of the recess R1 is dependent upon the size of the semiconductor device 1000A, the disclosure is not specifically thereto. On the other hand, the thickness T602 and the thickness T1 may be selected and designated to have sufficient stiffness based on design requirement of the recess R2 for avoid deformation while the bonding process, the disclosure is not limited thereto; where the thickness T1 is less than the thickness T602.

The flange portion 604 presents a thickness T604 (as measured along the direction Z) when extending towards the substrate 500 without recesses. The thickness T604 may be selected and designated based on the demand and/or design requirement, the disclosure is not limited thereto; where the thickness T602 is less than the thickness T604. For example, as shown in FIG. 4 and FIG. 7, the recess R1 has a depth substantially equal to the difference between the thickness T604 and the thickness T602 (e.g. T604-T602). In some embodiments, the cover portion 602A and the flange portion 604 are produced as a single piece (integrally formed). That is, the flange portion 604 and the cover portion 602A may be fabricated from the same material, and no interface or clear boundary may be visible between the flange portion 604 and the cover portion 602A. However, the disclosure is not limited thereto; the material of the flange portion 604 may be different from the material of the cover portion 602A. That is, the cover portion 602A and the flange portion 514A may be fabricated separately and then assembled to produce the heat dissipating lid 600A. In some embodiments, the heat dissipating lid 600A is molded, forged, 3D-printed, grown, or fabricated according to any other suitable technique. In alternative embodiments, the heat dissipating lid 600A is formed by a stamping process (with a mold) or a wire EDM process.

Figure 8A:
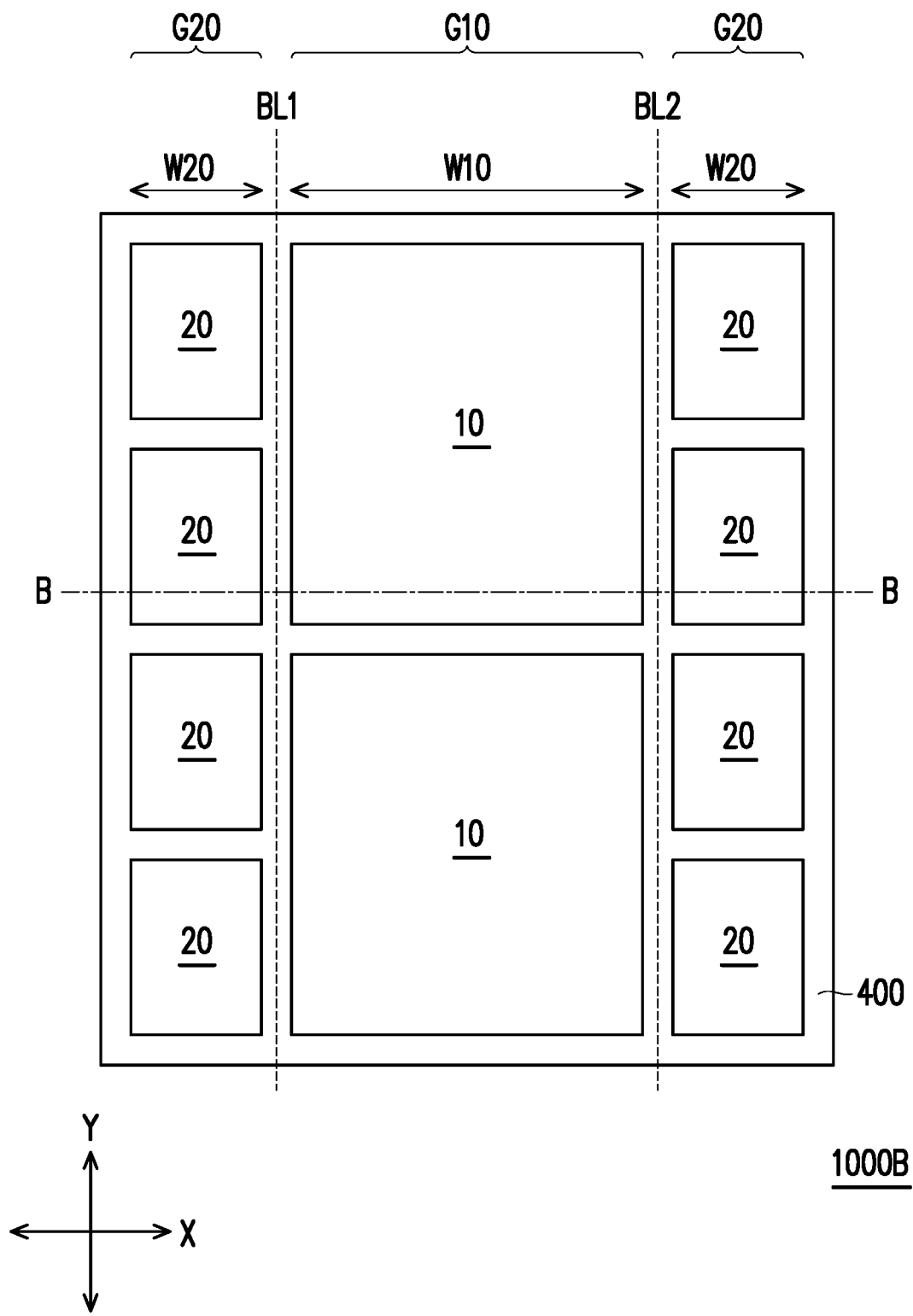
FIG. 8A is a schematic top view illustrating a layout of a semiconductor device of a package structure in accordance with some embodiments of the disclosure.
Figure 8B:
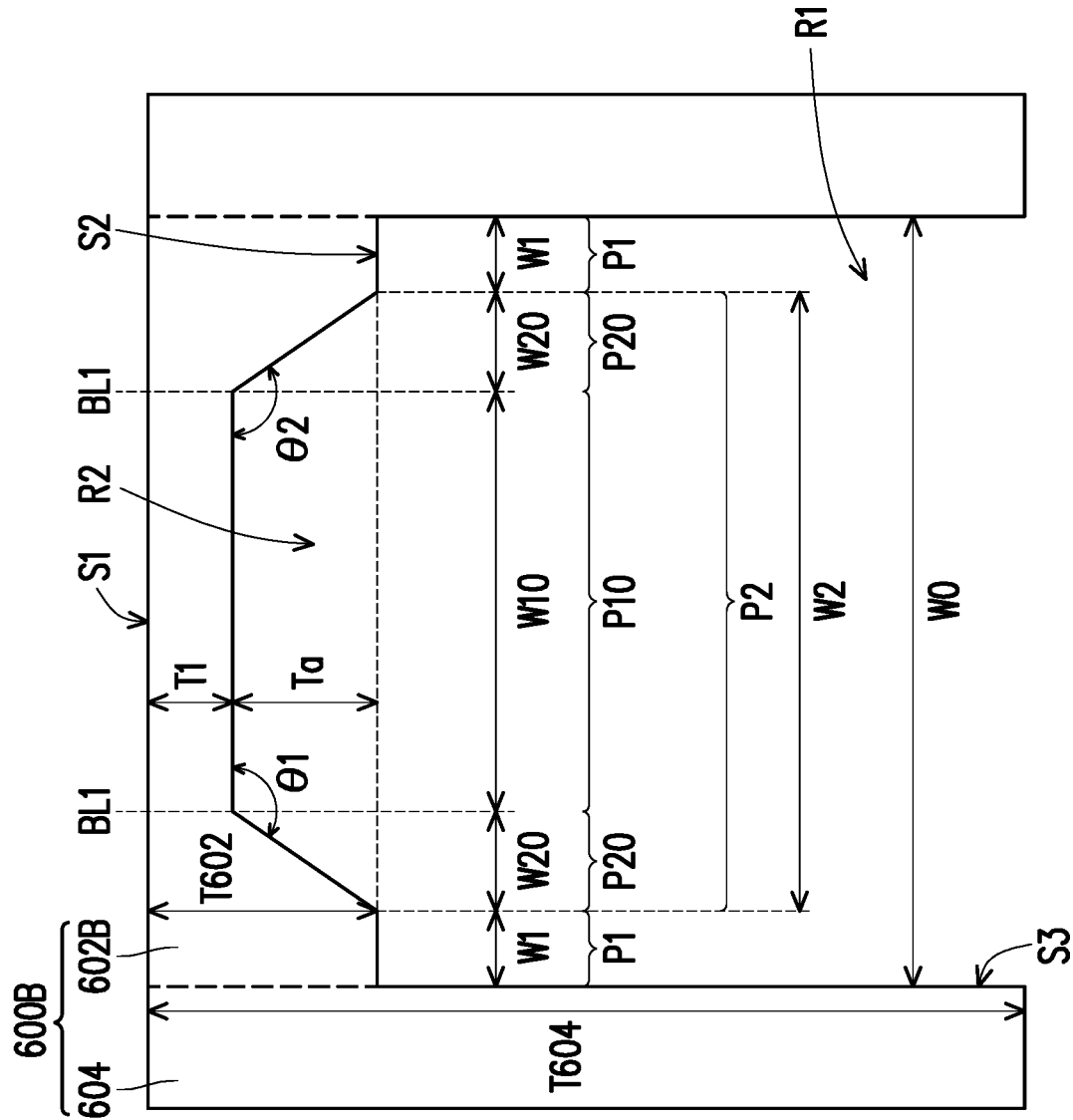
FIG. 8B is a schematic cross-sectional view of a heat dissipating lid corresponding to the semiconductor device depicted in FIG. 8A.

In the disclosure, the predetermined pattern of the recess R2 in the cross section of the heat dissipating lid is corresponding to the arrangement of the semiconductor dies 10 and 20 (e.g. the groups G10 and G20) in the semiconductor device, in some embodiments. For example, due to the arrangement of the semiconductor dies 10 and 20 (e.g. the groups G10 and G20) in the semiconductor device 1000A (depicted in FIG. 4 through FIG. 7), the predetermined pattern of the recess R2 in the cross section of the heat dissipating lid 600A includes a trapezoid. It is appreciated that the predetermined pattern of the recess R2 in the cross section of the heat dissipating lid 600A is corresponding to the arrangement of the semiconductor dies 10 and 20 (e.g. the groups G10 and G20) in the semiconductor device 1000A thermally coupled thereto, where the number of the semiconductor dies 10 in one group G10 and the number of the semiconductor dies 20 included in one group G20 are not limited to the disclosure. FIG. 8A is a schematic top view illustrating a layout of a semiconductor device of a package structure in accordance with some embodiments of the disclosure. FIG. 8B is a schematic cross-sectional view of a heat dissipating lid corresponding to the semiconductor device depicted in FIG. 8A, where the cross-sectional view of FIG. 8B is taken along a line BB depicted in FIG. 8A. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, a semiconductor device 1000B of FIG. 8A and a heat dissipating lid 600B of FIG. 8B may, at the same time, substitute the semiconductor device 1000A and the heat dissipating lid 600A of the package structure PS depicted in FIG. 4.

Referring to FIG. 4 through FIG. 7 and FIG. 8A through FIG. 8B together, the semiconductor device 1000A of FIG. 5 is similar to a semiconductor device 1000B of FIG. 8A; the difference is that, the semiconductor device 1000B of FIG. 8A includes two semiconductor dies 10 and eight semiconductor dies 20. The details of the semiconductor dies 10 and 20 have been previously described in FIG. 1, and thus are omitted for brevity. As shown in FIG. 8A, for example, in the layout of the semiconductor device 1000B, the semiconductor dies 10 is grouped into one group G10, and every four semiconductor dies 20 are grouped into one group G20, where the group G10 is sandwiched between two groups G20. In some embodiments, for the semiconductor device 1000B, the warping location BL1 is located between the group G10 and one of the groups G20, and the warping location BL2 is located between the group G10 and other one of the groups G20. With such, a cover portion 602B of the heat dissipating lid 600B includes a recess R2 having a predetermined pattern of a trapezoid in a cross section of the heat dissipating lid 600B, where the recces R2 has an included angle θ1 corresponding to the warping location BL1 and an included angle θ2 corresponding to the warping location BL2. Owing to the predetermined pattern of the recess R2 of the heat dissipating lid 600B (corresponding to the contour of the semiconductor device 1000B undergoing warpage), the engagement between the cover portion 602B of the heat dissipating lid 600B and the semiconductor device 1000B disposed with the thermal interface material 610 is greatly improved, thereby a coverage of the thermal interface material 610 in the package structure is significantly increased (e.g. reaching to about 90% to 100%).

In other words, as the arrangement of the semiconductor dies 10 and 20 (e.g. the groups G10 and G20) in the semiconductor device 1000B (depicted in FIG. 8A) is similar to or substantially the same as the arrangement of the semiconductor dies 10 and 20 (e.g. the groups G10 and G20) in the semiconductor device 1000A (depicted in FIG. 5), the predetermined pattern of the recess R2 in the cross section of the heat dissipating lid 600B corresponding to the semiconductor device 1000B is similar to or substantially the same as the predetermined pattern of the recess R2 in the cross section of the heat dissipating lid 600A corresponding to the semiconductor device 1000A. However, the disclosure is not limited thereto; alternatively, depending on the layout of a semiconductor device, the predetermined pattern (of the cross section) of the recess formed in the cover portion of the heat dissipating lid corresponding to the semiconductor device may include a triangle (see a heat dissipating lid 600C depicted in FIG. 9A and FIG. 9B), a semi-dome (see a heat dissipating lid 600D depicted in FIG. 10A and FIG. 10B), or other suitable polygon.

Figure 9A:
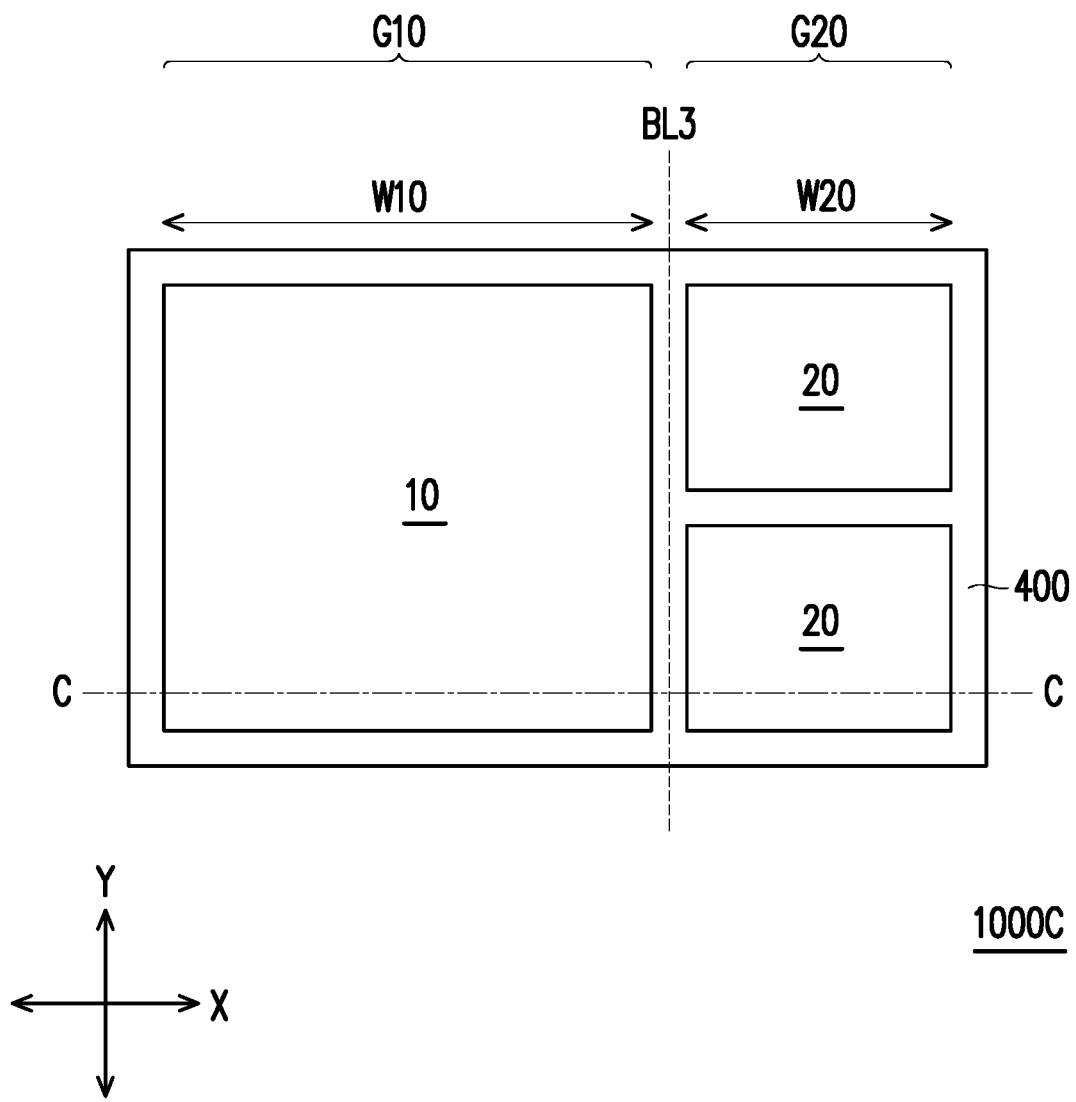
FIG. 9A is a schematic top view illustrating a layout of a semiconductor device of a package structure in accordance with some embodiments of the disclosure.
Figure 9B:
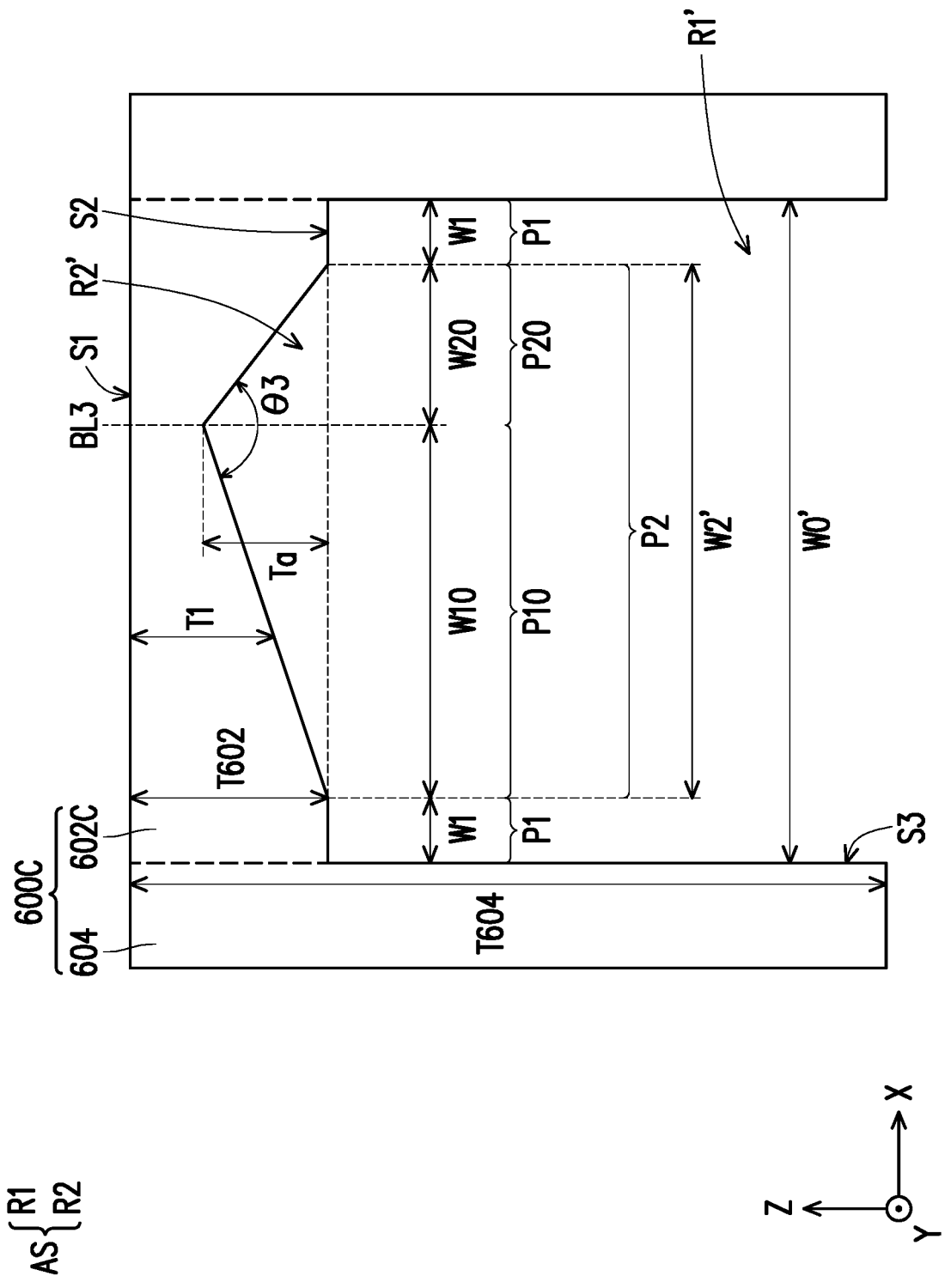
FIG. 9B is a schematic cross-sectional view of a heat dissipating lid corresponding to the semiconductor device depicted in FIG. 9A.

FIG. 9A is a schematic top view illustrating a layout of a semiconductor device of a package structure in accordance with some embodiments of the disclosure. FIG. 9B is a schematic cross-sectional view of a heat dissipating lid corresponding to the semiconductor device depicted in FIG. 9A, where the cross-sectional view of FIG. 9B is taken along a line CC depicted in FIG. 9A. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, a semiconductor device 1000C of FIG. 9A and a heat dissipating lid 600C of FIG. 9B may, at the same time, substitute the semiconductor device 1000A and the heat dissipating lid 600A of the package structure PS depicted in FIG. 4.

Referring to FIG. 4 through FIG. 7 and FIG. 9A through FIG. 9B together, the semiconductor device 1000A of FIG. 5 is similar to a semiconductor device 1000C of FIG. 9A; the difference is that, the semiconductor device 1000C of FIG. 9A includes one semiconductor die 10 and two semiconductor dies 20. The details of the semiconductor dies 10 and 20 have been previously described in FIG. 1, and thus are omitted for brevity. As shown in FIG. 9A, for example, in the layout of the semiconductor device 1000C, the semiconductor die 10 is identified as one group G10, and the two semiconductor dies 20 together are identified as one group G20, where the group G10 is adjoined to the group G20. In other words, the group G10 and the group G20 are arranged side-by-side. In some embodiments, for the semiconductor device 1000C, besides the warping occurring at the boundaries of the semiconductor dies 10, 20 and the insulating encapsulation 400, a warping location BL3 is located between the group G10 and the group G20. With such, a cover portion 602C of the heat dissipating lid 600C includes a recess R2' having a predetermined pattern of a triangle in a cross section of the heat dissipating lid 600C, where the recces R2' has an included angle θ3 corresponding to the warping location BL3. In some embodiments, the included angle θ3 has a non-rounded included angle (e.g., with sharp tips, see FIG. 9B) or rounded included angle (not shown) being greater than about 90° and less than about 180°. In such embodiment, a width W2' of the recess R2' is equal to a sum of the width W10 of the sub-portion P10 and the width W20 of the sub-portion P20 (e.g. a value of W10+W20), and a width W0' of the recess R1' is equal to a value of (W1)*2+W2'. Owing to the predetermined pattern of the recess R2' of the heat dissipating lid 600C (corresponding to the contour of the semiconductor device 1000C undergoing warpage), the engagement between the cover portion 602C of the heat dissipating lid 600C and the semiconductor device 1000C disposed with the thermal interface material 610 is greatly improved, thereby a coverage of the thermal interface material 610 in the package structure is significantly increased (e.g. reaching to about 90% to 100%).

Figure 10A:
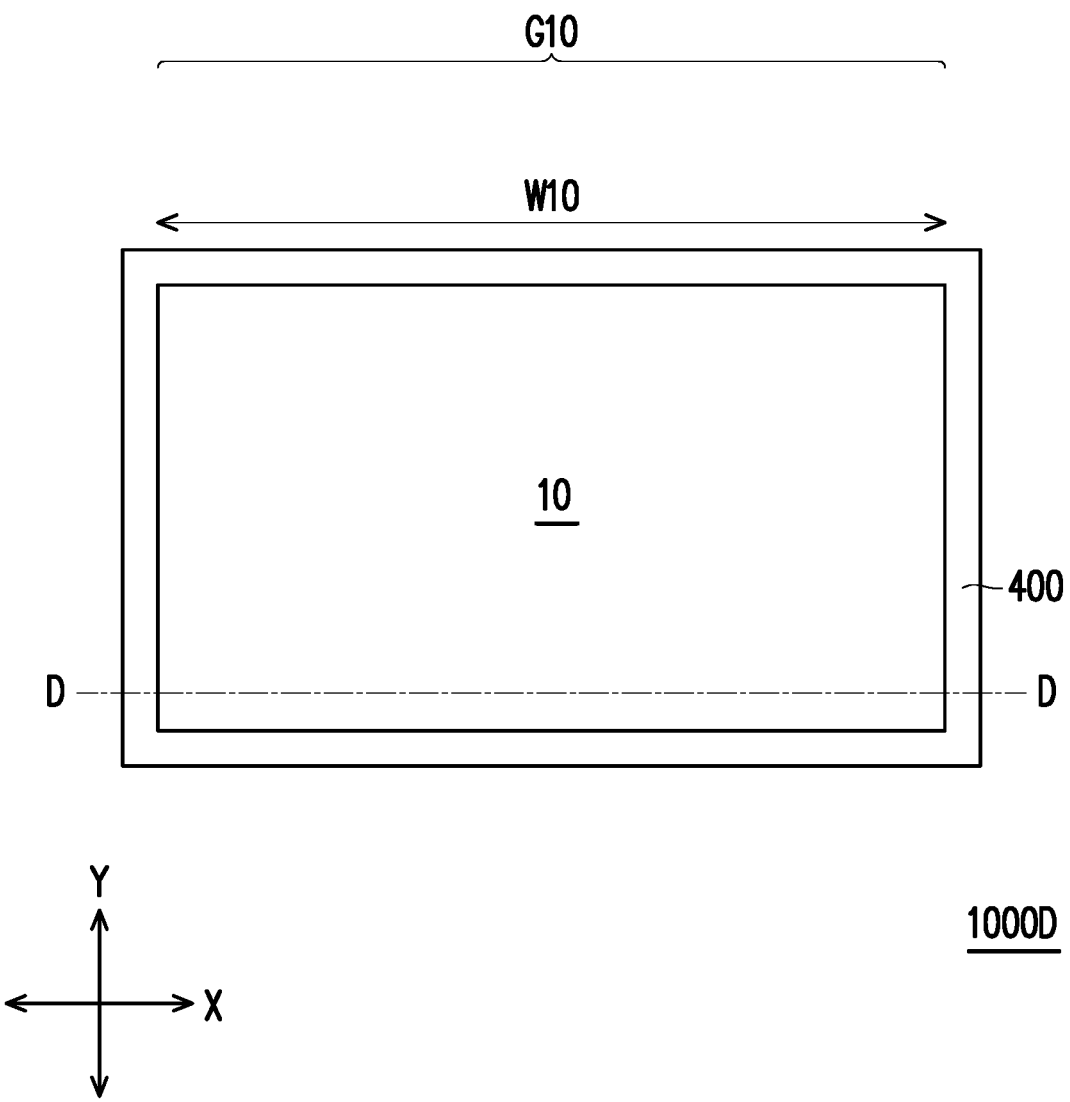
FIG. 10A is a schematic top view illustrating a layout of a semiconductor device of a package structure in accordance with some embodiments of the disclosure.
Figure 10B:
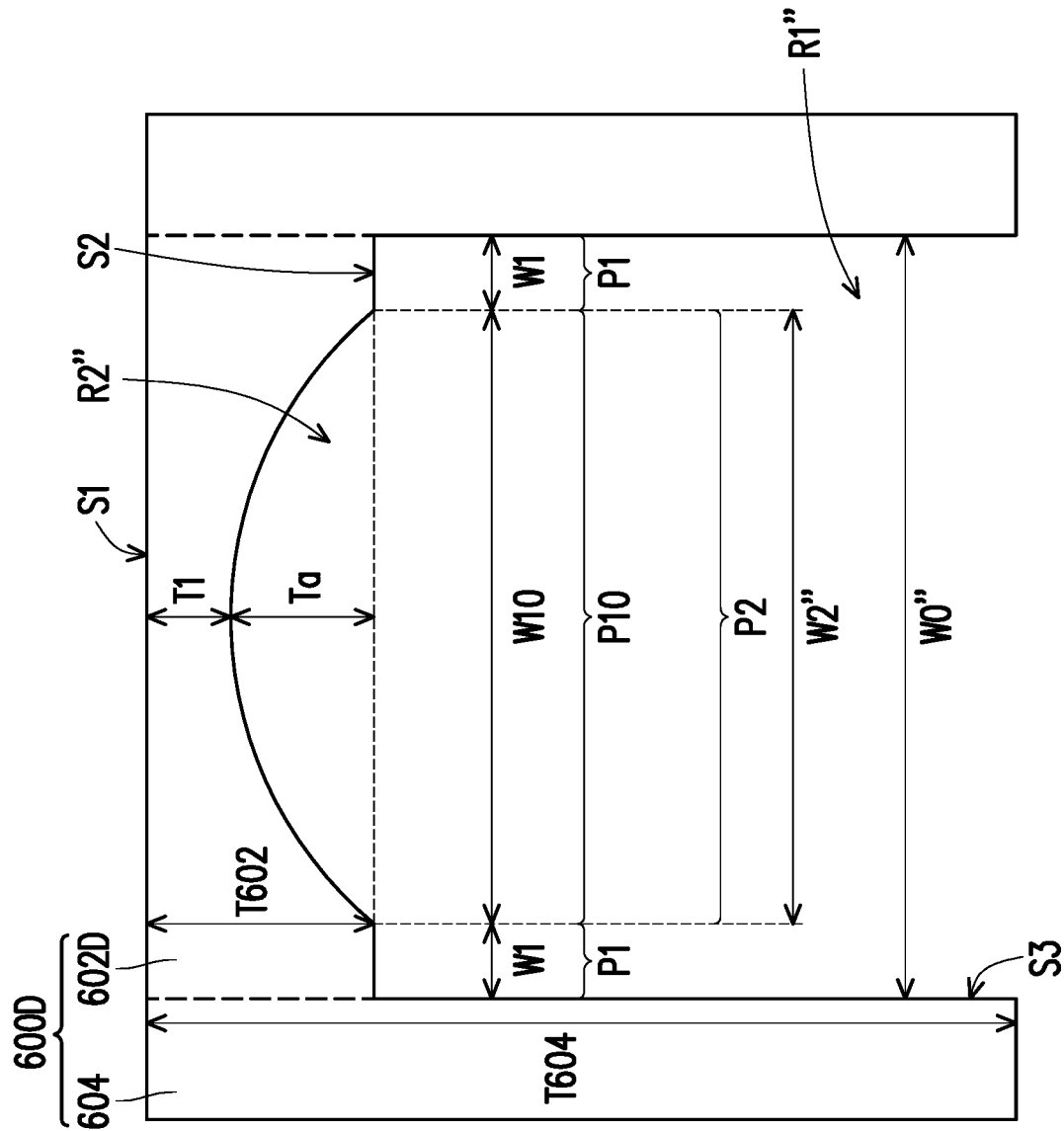
FIG. 10B is a schematic cross-sectional view of a heat dissipating lid corresponding to the semiconductor device depicted in FIG. 10A.

FIG. 10A is a schematic top view illustrating a layout of a semiconductor device of a package structure in accordance with some embodiments of the disclosure. FIG. 10B is a schematic cross-sectional view of a heat dissipating lid corresponding to the semiconductor device depicted in FIG. 10A, where the cross-sectional view of FIG. 10B is taken along a line DD depicted in FIG. 10A. The elements similar to or substantially the same as the elements described above will use the same reference numbers, and certain details or descriptions of the same elements (e.g. the formations and materials) and the relationship thereof (e.g. the relative positioning configuration and electrical connection) will not be repeated herein. In some embodiments, a semiconductor device 1000D of FIG. 10A and a heat dissipating lid 600D of FIG. 10B may, at the same time, substitute the semiconductor device 1000A and the heat dissipating lid 600A of the package structure PS depicted in FIG. 4.

Referring to FIG. 4 through FIG. 7 and FIG. 10A through FIG. 10B together, the semiconductor device 1000A of FIG. 5 is similar to a semiconductor device 1000D of FIG. 10A; the difference is that, the semiconductor device 1000D of FIG. 10A includes one semiconductor die 10 only. The detail of the semiconductor die 10 has been previously described in FIG. 1, and thus is omitted for brevity. As shown in FIG. 10A, for example, in the layout of the semiconductor device 1000D, the semiconductor die 10 is surrounded by the insulating encapsulation 400 and is identified as one group G10. In other words, in the semiconductor device 1000D, the warping location may occur at the boundary of the semiconductor die 10 and the insulating encapsulation 400. With such, a cover portion 602D of the heat dissipating lid 600D includes a recess R2" having a predetermined pattern of a semi-dome in a cross section of the heat dissipating lid 600D, where the recces R2" has a convex surface corresponding to the contour of the semiconductor device 1000D having a convex warpage. In some embodiments, a width W2" of the recess R2" is equal to the width W10 of the sub-portion P10, and a width W0" of the recess R1" is equal to a value of (W1)*2+W2". Owing to the predetermined pattern of the recess R2" of the heat dissipating lid 600D (corresponding to the contour of the semiconductor device 1000D undergoing warpage), the engagement between the cover portion 602D of the heat dissipating lid 600D and the semiconductor device 1000D disposed with the thermal interface material 610 is greatly improved, thereby a coverage of the thermal interface material 610 in the package structure is significantly increased (e.g. reaching to about 90% to 100%).

In accordance with some embodiments, a package structure includes a semiconductor device, a circuit substrate and a heat dissipating lid. The semiconductor device includes a semiconductor die. The circuit substrate is bonded to and electrically coupled to the semiconductor device. The heat dissipating lid is bonded to the circuit substrate and thermally coupled to the semiconductor device, where the semiconductor device is located in a space confined by the heat dissipating lid and the circuit substrate. The heat dissipating lid includes a cover portion and a flange portion bonded to a periphery of the cover portion. The cover portion has a first surface and a second surface opposite to the first surface, where the cover portion includes a recess therein, the recess has an opening at the second surface, and a thickness of the recess is less than a thickness of the cover portion, where the recess is part of the space.

In accordance with some embodiments, a package structure includes a semiconductor device, a circuit substrate and a heat dissipating lid. The semiconductor device includes a first semiconductor die and a second semiconductor die different from the first semiconductor die. The circuit substrate is bonded to and electrically coupled to the semiconductor device. The heat dissipating lid is bonded to the circuit substrate and thermally coupled to the semiconductor device, where the semiconductor device is enclosed by the heat dissipating lid and the circuit substrate. The heat dissipating lid includes a cover portion and a flange portion bonded to a periphery of the cover portion. The cover portion includes a recess formed therein, where in a cross-section, the recess has a predetermined pattern having an included angle corresponding to a location between the first semiconductor die and the second semiconductor die.

In accordance with some embodiments, a method of manufacturing a package structure includes the following steps: providing a semiconductor device comprising a semiconductor die; mounting the semiconductor device to a circuit substrate, wherein the circuit substrate being electrically coupled to the semiconductor device; forming a thermal interface material over a backside surface of the semiconductor device; and disposing a heat dissipating lid on the circuit substrate, the heat dissipating lid being thermally coupled to the semiconductor device through the thermal interface material, and the semiconductor device being located in a space confined by the heat dissipating lid and the circuit substrate, wherein the heat dissipating lid comprises a cover portion and a flange portion bonded to a periphery of the cover portion, the cover portion comprises a recess formed therein and being part of the space, and a thickness of the recess is less than a thickness of the cover portion.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a semiconductor device comprising a semiconductor die and an insulating encapsulation laterally covering the semiconductor die;
   a circuit substrate, bonded to and electrically coupled to the semiconductor device;
   a heat dissipating lid, bonded to the circuit substrate and thermally coupled to the semiconductor device, wherein the semiconductor device is located in a space confined by the heat dissipating lid and the circuit substrate, and the heat dissipating lid comprises:
      a cover portion, having a first surface and a second surface opposite to the first surface, wherein the cover portion comprises a recess therein, the recess has an opening at the second surface, and a thickness of the recess is less than a thickness of the cover portion, wherein the recess is part of the space, wherein the recess continuously extends across and spans an entire occupied area of the semiconductor device; and
      a flange portion, bonded to a periphery of the cover portion, wherein a material of the cover portion is the same as a material of the flange portion; and
   a thermal interface material layer, having opposite sides, wherein the opposite sides of the thermal interface material layer are respectively in contact with and thermally coupled to the cover portion and a surface of the semiconductor die being free of the insulating encapsulation.

2. The package structure of claim 1, wherein a portion of the thermal interface material is extended into the recess formed in the cover portion.

3. The package structure of claim 1, wherein the thickness of the recess is approximately from 50 μm to 100 μm as measured along a stacking direction of the semiconductor device and the circuit substrate.

4. The package structure of claim 1, wherein a projection of the semiconductor device is within a projection of the recess formed in the cover portion on the circuit substrate along a stacking direction of the semiconductor device and the circuit substrate.

5. The package structure of claim 4, wherein an area of the projection of the recess formed in the cover portion is greater than or substantially equal to an area of the projection of the semiconductor device.

6. The package structure of claim 1, wherein the cover portion comprises a first region and a second region, the recess formed in the first region of the cover portion is laterally distant from the flange portion by the second region,
   wherein in a plane view along a stacking direction of the semiconductor device and the circuit substrate, the first region is in a rectangular shape while the second region is in an annulus shape surrounding the rectangular shape of the first region.

7. The package structure of claim 1, wherein the cover portion and the flange portion are an integral of a single material.

8. The package structure of claim 1, wherein the first surface is a planar surface, and the second surface is a non-planar surface.

9. A package structure, comprising:
   a semiconductor device comprising a first semiconductor die, a second semiconductor die different from the first semiconductor die, and an insulating encapsulation encapsulating the first semiconductor die and the second semiconductor die;
   a circuit substrate, bonded to and electrically coupled to the semiconductor device; and
   a heat dissipating lid, bonded to the circuit substrate and thermally coupled to the semiconductor device, wherein the semiconductor device is enclosed by the heat dissipating lid and the circuit substrate, and the heat dissipating lid comprises:
      a cover portion, comprising a recess formed therein, wherein in a cross-section, the recess has a predetermined pattern having an included angle at a first location overlapped with a second location, and the second location is overlapped with a portion of the insulating encapsulation between the first semiconductor die and the second semiconductor die, wherein the recess completely covers the semiconductor device; and
      a flange portion, bonded to a periphery of the cover portion.

10. The package structure of claim 9, further comprising:
    a thermal interface material, disposed between the second surface of the heat dissipating lid and a backside surface of the semiconductor device,
    wherein a portion of the thermal interface material is extended into the recess formed in the cover portion,
    wherein the cover portion and the flange portion are an integral of a single material.

11. The package structure of claim 9, wherein a projection of the semiconductor device is within a projection of the recess formed in the cover portion on the circuit substrate along a stacking direction of the semiconductor device and the circuit substrate.

12. The package structure of claim 9, wherein the recess formed in the cover portion is laterally distant from the flange portion and has an opening facing towards the circuit substrate.

13. The package structure of claim 9, wherein the predetermined pattern comprises a triangle or a trapezoid.

14. The package structure of claim 9, wherein the included angle is greater than about 90° and less than about 180°.

15. The package structure of claim 9, wherein a thickness of the recess is approximately from 50 μm to 100 μm as measured along a stacking direction of the semiconductor device and the circuit substrate.

16. A method of manufacturing a package structure, comprising:
providing a semiconductor device comprising a semiconductor die and an insulating encapsulation laterally covering the semiconductor die;
mounting the semiconductor device to a circuit substrate, wherein the circuit substrate being electrically coupled to the semiconductor device;
forming a thermal interface material over a backside surface of the semiconductor device; and
disposing a heat dissipating lid on the circuit substrate, the heat dissipating lid being thermally coupled to the semiconductor device through the thermal interface material, and the semiconductor device being located in a space confined by the heat dissipating lid and the circuit substrate, wherein the heat dissipating lid comprises a cover portion and a flange portion bonded to a periphery of the cover portion, the cover portion has a first surface and a second surface opposite to the first surface, and the cover portion comprises a recess formed therein and being part of the space, wherein the recess has an opening at the second surface, the recess continuously extends across and spans an entire occupied area of the semiconductor device, and a thickness of the recess is less than a thickness of the cover portion, wherein a material of the cover portion is the same as a material of the flange portion, and the opposite sides of the thermal interface material layer are respectively in contact with and thermally coupled to the cover portion and a surface of the semiconductor die being free of the insulating encapsulation.

17. The method of claim 16, wherein the recess is formed in the cover portion through milling machining to have a predetermined pattern of a semi-dome, a triangle or a trapezoid in a cross section.

18. The method of claim 16, wherein the cover portion and the flange portion are integrally formed with a single material.

19. The method of claim 16, further comprising:
forming an underfill between a gap between the semiconductor device and the circuit substrate by underfill dispensing.

20. The method of claim 16, further comprising:
disposing a plurality of conductive terminals on a surface of the circuit substrate opposing to a surface thereof disposed with the semiconductor device, the plurality of conductive terminals being electrically connected to the semiconductor device through the circuit substrate.

* * * * *